United States Patent
Kim et al.

(10) Patent No.: US 9,798,241 B2
(45) Date of Patent: Oct. 24, 2017

(54) METHODS OF MANUFACTURING PHOTOMASKS, METHODS OF FORMING PHOTORESIST PATTERNS AND METHODS OF MANUFACTURING SEMICONDUCTOR DEVICES

(71) Applicant: SAMSUNG ELECTRONICS CO., LTD., Suwon-si, Gyeonggi-do (KR)

(72) Inventors: Sang-Hyun Kim, Hwaseong-si (KR); Dong-Gun Lee, Hwaseong-si (KR); Byoung-Hun Park, Suwon-si (KR); Byung-Gook Kim, Seoul (KR); Chan-Uk Jeon, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/983,851

(22) Filed: Dec. 30, 2015

(65) Prior Publication Data

US 2016/0202611 A1    Jul. 14, 2016

(30) Foreign Application Priority Data

Jan. 9, 2015    (KR) .................. 10-2015-0003553

(51) Int. Cl.
*C03C 15/00* (2006.01)
*G03F 7/38* (2006.01)
(Continued)

(52) U.S. Cl.
CPC .............. *G03F 7/38* (2013.01); *G03F 1/00* (2013.01); *H01L 21/0273* (2013.01); *H01L 21/0274* (2013.01); *H01L 21/0275* (2013.01); *H01L 21/31144* (2013.01); *H01L 21/76802* (2013.01); *H01L 27/10814* (2013.01); *H01L 27/10876* (2013.01); *H01L 27/10888* (2013.01)

(58) Field of Classification Search
CPC .......... G03F 7/70041; G03F 7/38; G03F 7/40; H01L 21/308; H01L 21/31116; H01L 21/0275; H01L 21/76802; H01L 27/10814; H01L 21/0273
USPC ................. 216/41, 47, 49, 51; 430/312, 313
See application file for complete search history.

(56) References Cited

U.S. PATENT DOCUMENTS

| 6,100,012 A | 8/2000 | Shi |
| 6,730,984 B1 | 5/2004 | Ballantine et al. |

(Continued)

FOREIGN PATENT DOCUMENTS

| JP | 05-267162 A | 10/1993 |
| JP | 2000-260687 A | 9/2000 |

(Continued)

*Primary Examiner* — Lan Vinh
(74) *Attorney, Agent, or Firm* — Lee & Morse, P.C.

(57) ABSTRACT

A method of patterning a photoresist layer includes forming a photoresist layer on a substrate, exposing the photoresist layer to light using a first light source so as to induce a chemical change in the photoresist layer, performing a post-exposure bake process on the photoresist layer, the post-exposure bake process including irradiating the photoresist layer with at least two shots of laser light from a second light source such that the photoresist layer is heated to a first temperature, and performing a developing process on the photoresist layer after the post-exposure bake process, the development process selectively removing a portion of the photoresist layer.

17 Claims, 28 Drawing Sheets

(51) Int. Cl.
*H01L 21/027* (2006.01)
*G03F 1/00* (2012.01)
*H01L 21/311* (2006.01)
*H01L 27/108* (2006.01)
*H01L 21/768* (2006.01)

(56) References Cited

U.S. PATENT DOCUMENTS

| | | | |
|---|---|---|---|
| 7,150,949 B2* | 12/2006 | Askebjer | G03F 7/70558 |
| | | | 430/30 |
| 8,623,469 B2 | 1/2014 | Shimomura et al. | |
| 9,085,045 B2* | 7/2015 | Scheer | H01L 21/268 |
| 2004/0043310 A1* | 3/2004 | Takeishi | G03F 9/7076 |
| | | | 430/22 |
| 2004/0097103 A1 | 5/2004 | Imai et al. | |
| 2007/0275321 A1* | 11/2007 | LaFontaine | G03F 7/0382 |
| | | | 430/270.1 |
| 2012/0024855 A1* | 2/2012 | Smyers | B65D 1/34 |
| | | | 220/324 |
| 2012/0164587 A1* | 6/2012 | Singer | B82Y 10/00 |
| | | | 430/326 |

FOREIGN PATENT DOCUMENTS

| | | |
|---|---|---|
| JP | 2005-099537 A | 4/2005 |
| JP | 2006-171472 A | 6/2006 |
| JP | 2011-099956 A | 5/2011 |
| JP | 2014-049456 A | 3/2014 |
| KR | 10-1999-0066582 A | 8/1999 |
| KR | 10-2000-0045928 A | 7/2000 |
| KR | 10-0635506 B1 | 10/2006 |
| KR | 10-0721959 B1 | 5/2007 |
| KR | 10-2007-0068335 A | 6/2007 |

* cited by examiner

FIRST DIRECTION

SECOND DIRECTION

FIRST
DIRECTION

SECOND
DIRECTION

METHODS OF MANUFACTURING PHOTOMASKS, METHODS OF FORMING PHOTORESIST PATTERNS AND METHODS OF MANUFACTURING SEMICONDUCTOR DEVICES

CROSS-REFERENCE TO RELATED APPLICATION

This application claims priority under 35 U.S.C. §119 to Korean Patent Application No. 10-2015-0003553, filed on Jan. 9, 2015, in the Korean Intellectual Property Office (KIPO), the contents of which are incorporated by reference herein in their entirety.

BACKGROUND

1. Field

Embodiments relate to methods of manufacturing photomasks, methods of forming photoresist patterns and methods of manufacturing semiconductor devices.

2. Description of the Related Art

Photolithography may be used to form a patterned layer. A photolithographic process may use a photoresist layer that responds to irradiation of light. Qualities of the irradiated photoresist layer, e.g., qualities of an image formed therein by irradiation of the light, may affect the quality of a patterned layer formed using the photoresist layer.

SUMMARY

Embodiments are directed to a method of patterning a photoresist layer, the method including forming a photoresist layer on a substrate, exposing the photoresist layer to light using a first light source so as to induce a chemical change in the photoresist layer, performing a post-exposure bake process on the photoresist layer, the post-exposure bake process including irradiating the photoresist layer with at least two shots of laser light from a second light source such that the photoresist layer is heated to a first temperature, and performing a developing process on the photoresist layer after the post-exposure bake process, the development process selectively removing a portion of the photoresist layer.

Each shot of the at least two shots may have a duration of one millisecond or less.

Each shot of the at least two shots may have a same duration.

A shot of the at least two shots may have a duration that is different from a duration of another of the at least two shots.

Each shot of the at least two shots may heat the photoresist layer irradiated by the laser light to the first temperature.

An interval time between shots varies between at least two of the shots.

The exposed photoresist layer may be activated at the first temperature.

Activating the exposed photoresist layer at the first temperature may include removing a protecting group from a chemical compound in the photoresist layer.

The method may further comprise not providing a separate cooling time following the post-exposure bake.

The first light source may be an ArF source, a KrF source, an electron beam source, an I-line source, or an extreme ultraviolet source, and the second light source may be an infrared source.

The photoresist layer may include a photoacid generator, and the chemical change in the photoresist layer may include generating an acid from the photoacid generator.

The shots may overlap in a plan view of the photoresist layer.

At least two shots may overlap.

Three or more shots may overlap.

The laser light may be irradiated on the photoresist layer in a first direction, and the shots may overlap in a second direction different from the first direction.

The second direction may be substantially perpendicular to the first direction.

Embodiments are also directed to a method of manufacturing a semiconductor device, the method including forming a photoresist layer on a substrate, exposing the photoresist layer to light using a first light source so as to induce a chemical change in the photoresist layer, performing a post-exposure bake process on the photoresist layer, the post-exposure bake process including irradiating the photoresist layer with at least two shots of laser light from a second light source such that the photoresist layer is heated to a first temperature, performing a developing process on the photoresist layer after the post-exposure bake process, the development process selectively removing a portion of the photoresist layer, and patterning a layer underlying the developed photoresist layer.

Embodiments are also directed to a device manufactured according to a method according to an embodiment.

BRIEF DESCRIPTION OF THE DRAWINGS

Features will become apparent to those of skill in the art by describing in detail exemplary embodiments with reference to the attached drawings in which.

DESCRIPTION OF EMBODIMENTS

Figure 1:
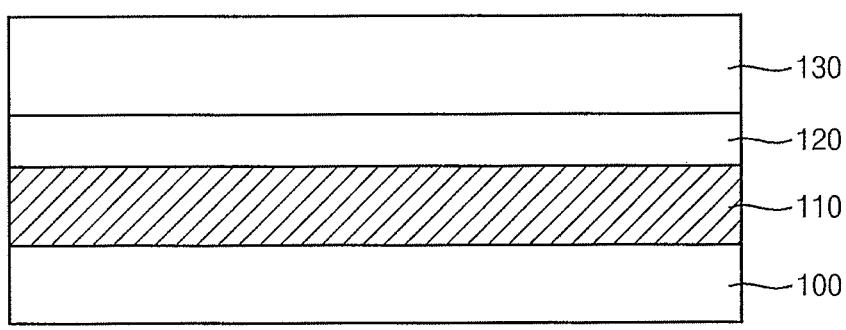
FIGS. 1 to 7 are cross-sectional views illustrating a method of manufacturing a photomask in accordance with example embodiments.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In the drawing figures, the dimensions of layers and regions may be exaggerated for clarity of illustration. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to an example embodiment, a peak temperature of each laser shot in a post-exposure bake operation may be controlled so that activation of an exposed portion progresses, while reducing or eliminating exposure to temperatures that damage a photoresist layer.

FIGS. 1 to 7 are cross-sectional views illustrating a method of manufacturing a photomask in accordance with example embodiments.

Referring to FIG. 1, a light-shielding layer 110, an anti-reflective layer 120 and a mask resist layer 130 may be sequentially formed on a top surface of a transparent substrate 100 to prepare a blank mask.

The transparent substrate 100 may include a material through which an irradiated light during an exposure process may be transmitted. For example, the transparent substrate 100 may include quartz or glass.

The light-shielding layer 110 may include a material that may block the irradiated light penetrating the transparent substrate 100. For example, the light-shielding layer 110 may be formed of a metal such as chromium (Cr) (chrome), aluminum (Al), rubidium (Ru), tantalum (Ta) or molybdenum (Mo). The light-shielding layer 110 may be formed by, e.g., a physical vapor deposition (PVD) process, a sputtering process or an atomic layer deposition (ALD) process.

The anti-reflective layer 120 may prevent light reflection while performing the subsequent exposure process on the mask resist layer 130. In some embodiments, the anti-reflective layer 120 may be formed of an inorganic material such as chromium oxide, chromium nitride, titanium nitride, or titanium nitride. In this case, the anti-reflective layer may be formed by, e.g., a PVD process, a sputtering process, a chemical vapor deposition (CVD) process or an ALD process.

In some embodiments, the anti-reflective layer 120 may be formed of an organic resist material. In this case, the anti-reflective layer 120 may be formed using a BARC (Bottom Anti-Reflective Coating) composition by, e.g., a spin coating process.

The mask resist layer 130 may be formed by coating a photoresist composition through a spin coating process and performing a soft-baking process.

The photoresist composition may be prepared by dissolving a photoresist material in an organic solvent. The photoresist composition may further include a photo acid generator (PAG) and a sensitizer.

The photoresist material may include a positive-type polymer material, in which a cross-linked bond may be decomposed or a protecting group may be separated from a backbone chain at a portion exposed to light.

The backbone chain may include, e.g., a chain structure of novolac, polystyrene, polyhydroxystyrene (PHS), polyacrylate, polymethacrylate, polyvinyl ester, polyvinyl ether, polyolefin, polynorbornene, polyester, polyamide or polycarbonate.

The protecting group may include, e.g., an acetal group, an ether group, or a thioether group. For example, t-butyloxycarbonyl (t-Boc) may be used as an ether protecting group.

The photoresist material may include a negative-type polymer material, in which a cross-linking reaction may occur at a non-exposed portion, and the non-exposed portion may be cured.

Hereinafter, example embodiments are described using the positive-type polymer material as an example of the photoresist material.

The PAG may include a suitable compound capable of generating an acid by an exposure process. For example, the PAG may include an onium salt, an aromatic diazonium salt, a sulfonium salt, a triarylsulfonium salt, a diarylsulfonium salt, a monoarylsulfonium salt, an iodonium salt, a diaryliodonium salt, nitrobenzyl ester, disulfone, diazo-disulfone, sulfonate, trichloromethyl triazine, or N-hydroxysuccinimide triflate. These may be used alone or in a combination thereof.

The sensitizer may amplify an amount of photons to facilitate a formation of an exposed portion. Examples of the sensitizer may include benzophenone, benzoyl, thiophene, naphthalene, anthracene, phenanthrene, pyrene, coumarin, thioxantone, acetophenone, naphtoquinone, and anthraquinone. These may be used alone or in a combination thereof.

In some embodiments, the soft-baking process for the formation of the mask resist layer 130 may include a thermal treatment using a hot plate. For example, the transparent substrate 100 may be placed on the hot plate such that a bottom surface of the transparent substrate 100 may contact the hot plate. The bottom surface of transparent substrate 100 may be heated to a predetermined temperature through the hot plate so that the photoresist composition may be preliminarily cured.

A temperature of the soft-baking process may be determined in consideration of a type of the organic solvent. For example, temperature of the soft-baking process may range from about 30° C. to about 100° C.

Figure 2:
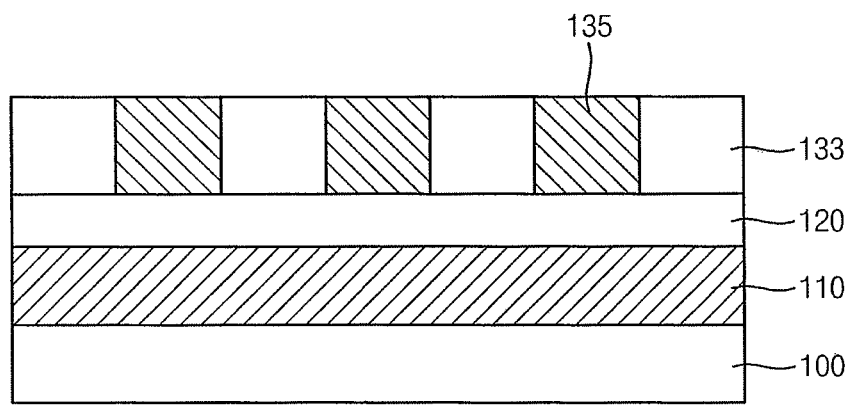

Referring to FIG. 2, the mask resist layer 130 may be selectively exposed to light to form an exposed portion 135. A remaining portion of the mask resist layer 130 (i.e., except for the exposed portion 135) may be defined as a non-exposed portion 133.

An acid (H+) may be generated from the PAG included in the photoresist composition at the exposed portion 135. A light-source for the exposure process may include, e.g., an ArF source, a KrF source, an electron beam source, an I-line source, an EUV (extreme ultraviolet) source, etc.

Figure 3:
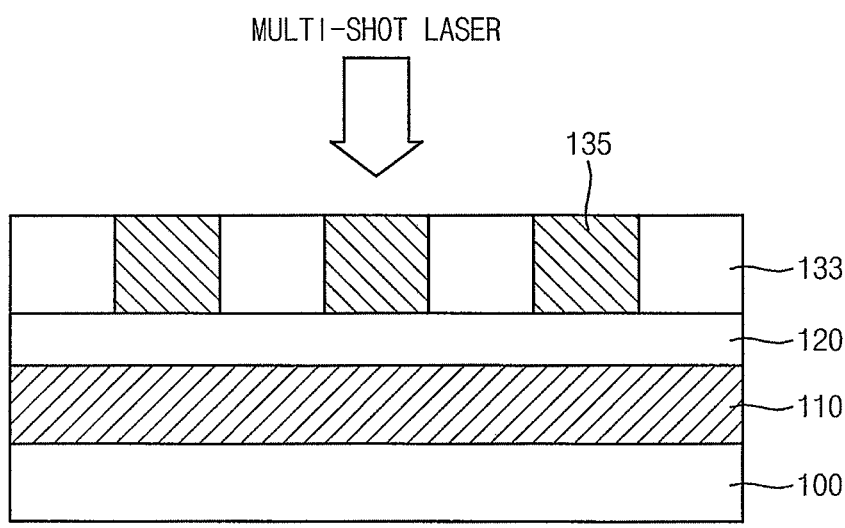

Referring to FIG. 3, a post-exposure baking (PEB) process may be performed on the mask resist layer 130.

In example embodiments, the PEB process may include a multi-shot laser process. For example, a plurality of laser shots may be irradiated on the mask resist layer 130 after the exposure process.

A laser source for the multi-shot laser process may be located over the transparent substrate 100 on which the mask resist layer 130 is formed. Thus, a top surface of the transparent substrate 100 may be rapidly heated and cooled by each laser shot. The laser source may provide, e.g., laser light having an infrared wavelength in a range from about 500 nm to about 1,000 nm. In some embodiments, the laser light may have an infrared wavelength in a range from about 800 nm to about 1,000 nm. The laser light may be and may be emitted as, e.g., a square or rectangular wave pulse.

The plurality of the laser shots may be successively and sequentially irradiated at a predetermined time interval.

In some embodiments, the plurality of the laser shots may be successively and sequentially irradiated on a specific spot, such as a central portion of the mask resist layer 130. In some embodiments, the plurality of the laser shots may be successively irradiated on each exposed portion 135. Accordingly, an activation of each exposed portion 135 may be facilitated by the PEB process.

According to the present example embodiment, the PEB process may be performed using the plurality of the laser shots, e.g., instead of the hot plate. In the PEB process using the hot plate, the transparent substrate 100 may be heated from the bottom surface thereof. Thus, a baking time may be significantly increased as a volume of the transparent substrate 100 becomes larger. As a result, the mask resist layer 130 may be damaged and/or a baking temperature may be limited below a critical temperature for the activation of the exposed portion 135. According to the present example embodiment, a single laser shot may be successively irradiated multiple times and/or at a predetermined time interval. For example, each laser shot may be irradiated from above of the transparent substrate 100, and may rapidly heat and cool the top surface of the transparent substrate 100 in a range of, e.g., a sub-millisecond.

The number of the single laser shots and/or a shot length of each single laser shot may be adjusted so that a sufficient effective baking time may be achieved above the critical temperature for the activation of the exposed portion 135. As described in further detail below in connection with FIG. 10, a peak temperature of each laser shot may be controlled so that activation of the exposed portion progresses, while reducing or eliminating exposure to temperatures that damage the photoresist layer.

Referring again to FIG. 3, the exposed portion 135 may be activated by the PEB process. For example, the acid generated from the PAG during the exposure process may be diffused uniformly throughout the exposed portion 135. Thus, the protecting group such as the acetal group or the ether group combined with the backbone chain of the photoresist material may be deprotected or separated at the exposed portion 135. Therefore, the exposed portion 135 may be chemically modified. For example, the exposed portion 135 may have a hydrophilicity and/or a polarity greater than those of the non-exposed portion 133.

Figure 4:
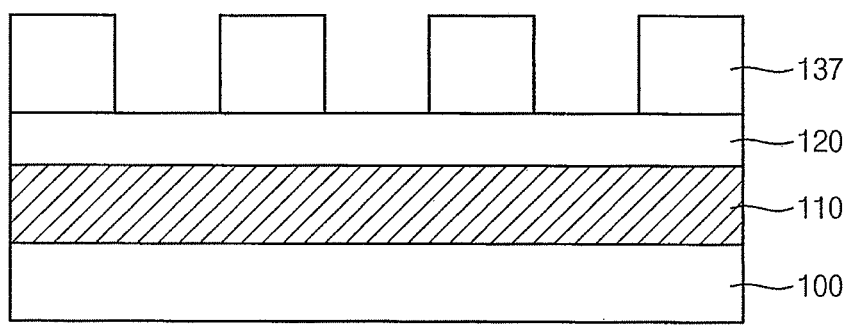

Referring to FIG. 4, the exposed portion 135 may be selectively removed using a developer solution. Accordingly, a mask resist pattern 137 may be defined by the non-exposed portion 133 remaining on the anti-reflective layer 120.

The developer solution may include, e.g., an alcohol-based solution or a hydroxide-based solution such as tetra methyl ammonium hydroxide (TMAH). As mentioned above, the exposed portion 135 may be converted into a pattern having highly increased hydrophilicity and/or polarity relatively to the non-exposed portion 133. Thus, the exposed portion 135 only may be removed by a polar solution such as TMAH.

In some embodiments, a hard-baking process may be further performed after the exposure process. The mask resist pattern 137 may be further cured by the hard-baking process. For example, the hard-baking process may be performed at a temperature ranging from about 100° C. to about 200° C.

In an embodiment, the hard-baking process may include a thermal treatment using a hot plate. For example, the transparent substrate 100 may be placed on the hot plate such that the bottom surface of the transparent substrate 100 may contact the hot plate. The transparent substrate 100 may be heated to a predetermined temperature from the bottom surface thereof through the hot plate so that the mask resist pattern 137 may be cured.

Examples are described above with reference to a positive resist. If the photoresist material is the negative-type, the non-exposed portion 133 may be selectively removed by the developer solution.

Figure 5:
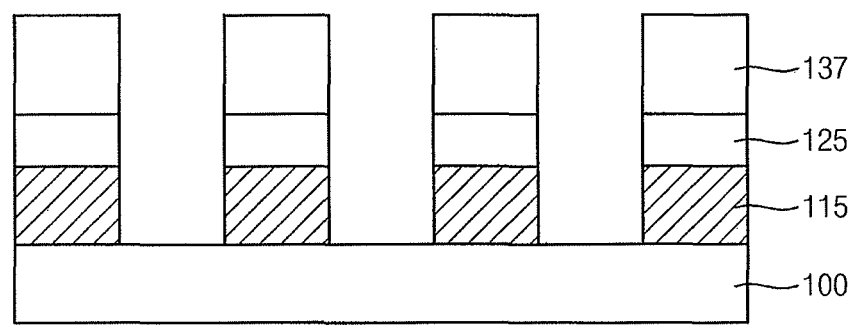

Referring to FIG. 5, the anti-reflective layer 120 and the light-shielding layer 110 may be partially removed using the mask resist pattern 137 as an etching mask. Accordingly, an anti-reflective layer pattern 125 and a light-shielding layer pattern 115 may be formed under the mask resist pattern 137.

Figure 6:
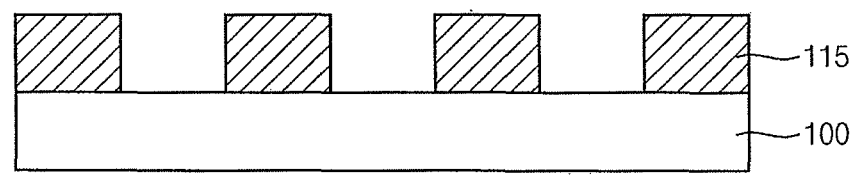

Referring to FIG. 6, the mask resist pattern 137 and the anti-reflective layer pattern 125 may be removed. In example embodiments, the mask resist pattern 137 and the anti-reflective layer pattern 125 may be removed by an ashing process and/or a strip process. In some embodiments, the mask resist pattern 137 and the anti-reflective layer pattern 125 may be removed using a thinner composition.

Figure 7:
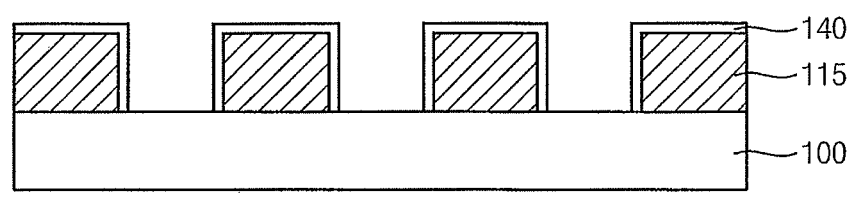

Referring to FIG. 7, a protective layer 140 may be further formed on a surface of the light-shielding layer pattern 115. For example, the protective layer 140 may be formed on a sidewall and a top surface of each light-shielding layer pattern 115.

In example embodiments, the protective layer 140 may be formed by oxidizing and/or nitriding the surface of the light-shielding layer pattern 115. For example, a plasma treatment using oxygen ($O_2$) and nitrogen ($N_2$) as a reactive gas may be performed on the light-shielding layer pattern 115 to form the protective layer 140.

If the light-shielding layer pattern 115 includes chrome, the protective layer 140 may include, e.g., chrome oxide, chrome nitride, and/or chrome oxynitride.

The protective layer 140 may also serve as an anti-reflective layer during an exposure process using the photomask. Additionally, the protective layer 140 may prevent the light-shielding layer pattern 115 from being damaged by, e.g., an acid solution used in a re-pellicle process for a recycle of the photomask.

A pellicle may be attached to the light-shielding layer pattern 115 to provide a protection of the photomask.

Figure 8:
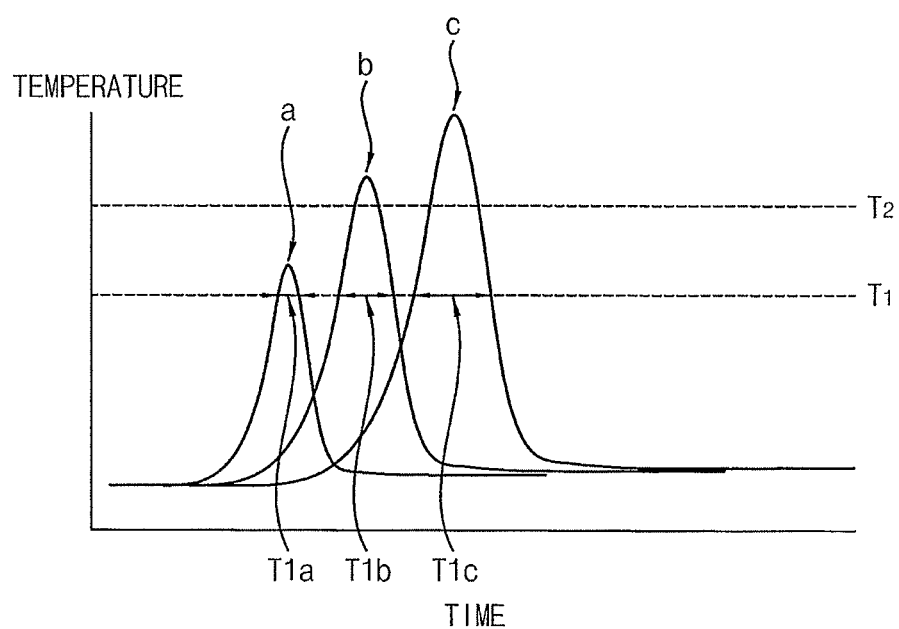
FIG. 8 is a graph showing a post-exposure baking (PEB) process in accordance with a comparative example.
Figure 9:
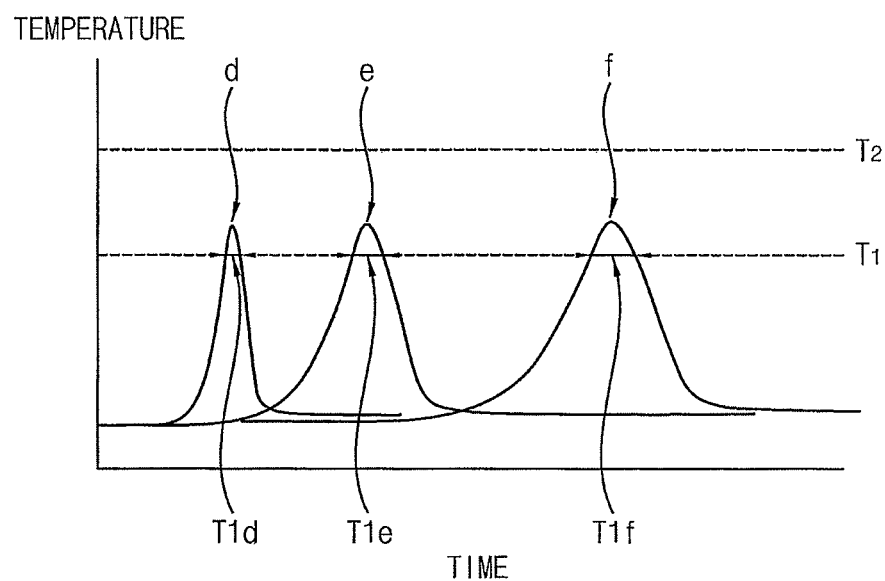
FIG. 9 is a graph showing a post-exposure baking (PEB) process in accordance with a different comparative example.

FIGS. 8 and 9 are graphs showing various comparative examples of post-exposure baking (PEB) processes. FIGS. 8 and 9 include graph overlays showing a relation of an irradiation time and a temperature of the single laser shot for the PEB process. The time scale in FIGS. 8 and 9 is not necessarily the same.

In FIGS. 8 and 9, "T1" may represent a minimum temperature at which a protecting group is separated by the PEB process to activate an exposed portion (hereinafter referred to as a first temperature). "T2" may represent a maximum temperature at which a photoresist layer is not physically and chemically damaged during the PEB process (hereinafter referred to as a second temperature).

In FIGS. 8-10, Y-axes indicate the temperatures of the objects (e.g., resist layers) irradiated by the laser shots.

FIG. 8 illustrates three different cases (a/b/c). The three cases are overlaid on the same graph in order to highlight the different features of each case relative to the other cases. Referring to FIG. 8, when the single laser shot is irradiated, a temperature distribution of the laser shot may form a substantially normal distribution curve (cases a, b, and c). An effective baking time for the activation of the exposed portion may substantially correspond to a length of an intersection portion of a horizontal line indicating the first temperature with the temperature distribution curve (times $T_{1a}$, $T_{1b}$, and $T_{1c}$ are respectively increased). Thus, when a temperature of the single laser shot is increased so as to achieve the sufficient effective baking time (e.g., temperatures for cases b and c are increased relative to case a (such that times $T_{1b}$ and $T_{1c}$ are increased relative to time $T_{1a}$), a peak temperature may exceed the second temperature (cases b and c), which may result in a damage of a backbone chain in the photoresist layer (e.g., case c may be more damaging than case b).

FIG. 9 illustrates three different cases (d/e/f). Referring to FIG. 9, as shown from a left curve to a right curve, even through the irradiation time of the single laser shot is increased (resulting in respective increases in the times $T_{1d}$, $T_{1e}$, and $T_{1f}$), sufficient effective baking time performed at a temperature above the first temperature may not be obtained.

Figure 10A:
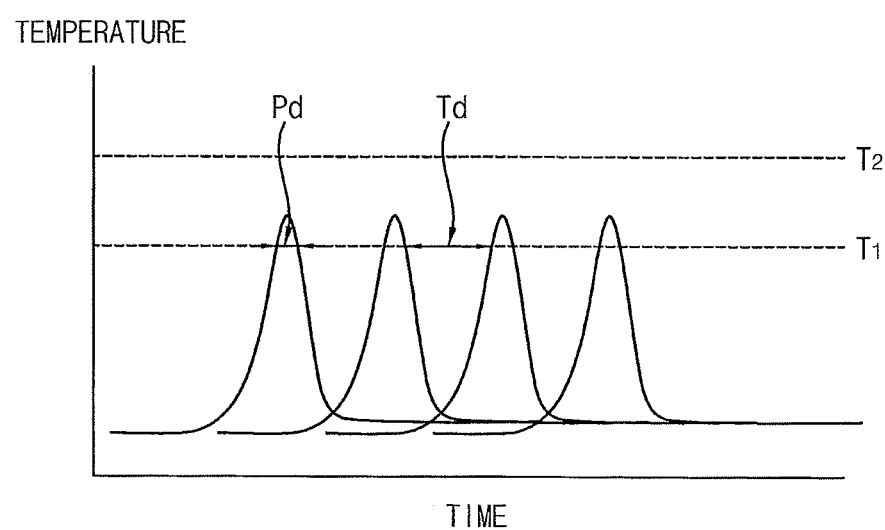
FIGS. 10A and 10B are graphs showing a PEB process in accordance with example embodiments.
Figure 10B:
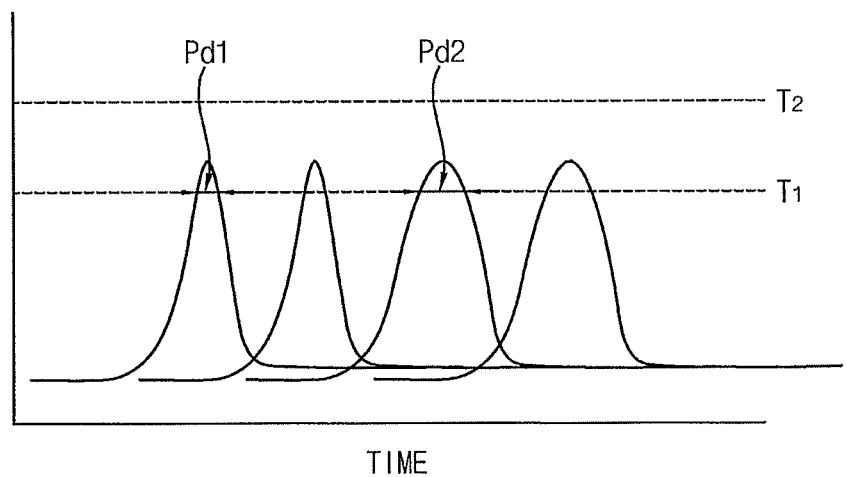

FIGS. 10A and 10B are graphs showing a PEB process in accordance with an example embodiment. The definitions of the first temperature T1 and the second temperature T2 in FIGS. 8 and 9 also apply to FIGS. 10A and 10B.

Referring to FIGS. 10A and 10B, a plurality of laser shots is used to irradiate a sample. Each single laser shot is represented by a single curve. The plurality of the single laser shots (as indicated by 4 curves in FIGS. 10A and 10B) may be irradiated successively by a predetermined time interval.

For example, a shot length of the each single laser shot at temperature $T_1$ may be represented by "Pd." The shot length may be substantially equal to an effective baking time by the single laser shot. A distance between the single laser shots neighboring each other may be represented by "Td."

A peak temperature of the each single laser shot may be controlled to be between the first temperature and the second temperature so that an activation of the exposed portion may be progressed, while preventing a damage of the photoresist layer. For example, in an embodiment, each shot length Pd may have a duration of one millisecond or less.

As illustrated in FIG. 10A, the plurality of the single laser shots may be controlled to have a substantially uniform shot length or duration as represented by "Pd."

In some embodiments, as illustrated in FIG. 10B, the plurality of the single laser shots may be controlled to have different shot lengths or durations. For example, at least one of the single laser shots may have a shot length Pd1, and another single laser shot may have a shot length Pd2 that may be longer than the shot length Pd1.

In the multi-shot laser process according to the present example embodiment, the number of the single laser shots and/or the shot length of the each single laser shot may be adjusted so that a total effective baking time of the PEB process may be controlled. The total effective baking time may be represented by an interrelation equation below:

$$\text{Total Effective Baking Time }(T) = \text{Number of Laser Shots }(n) \times \text{Shot Length }(Pd) \qquad \text{[Equation]}$$

As mentioned above, a top surface of a substrate may be heated by the each single laser shot in a sub-millisecond time frame. Thus, the total effective baking time may be easily and finely controlled.

In example embodiments, the distance Td between the shots may be optimally adjusted to progress the activation of the exposed portion while reducing or eliminating damage of the photoresist layer.

If the distance Td is excessively short, a plurality of the single laser shots may overlap to be integral or merged with each other. Accordingly, curves representing the laser shots may be merged with or added to each other so that the peak temperature may exceed the second temperature T2. As a result, a backbone chain in the photoresist layer may be decomposed.

If the distance Td is excessively increased, the photoresist layer or the substrate may be cooled before an irradiation of a subsequent laser shot. Thus, a substantially successive effective baking time may not be obtained.

According to example embodiments as described above, variables such as the number of the laser shots, the shot length of the laser shot, and the distance between the neighboring laser shots may be adjusted so that a sufficient diffusion of the acid may be realized while maintaining a stability of the photoresist layer. Additionally, the photoresist layer may be uniformly removed by a subsequent developing process due to an averaging effect of the plurality of the laser shots.

Figure 11:
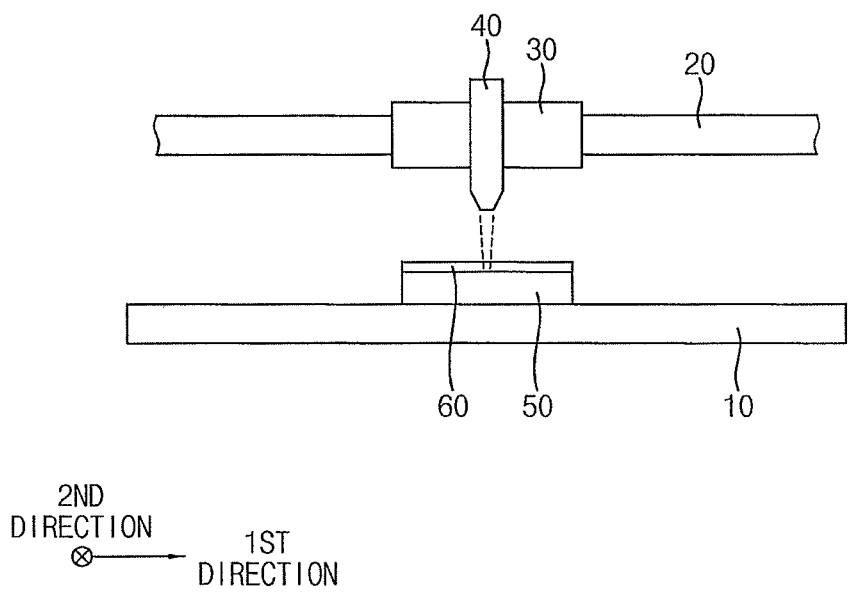
FIG. 11 is a schematic view illustrating an apparatus for irradiating laser shots in accordance with example embodiments.
Figure 12A:
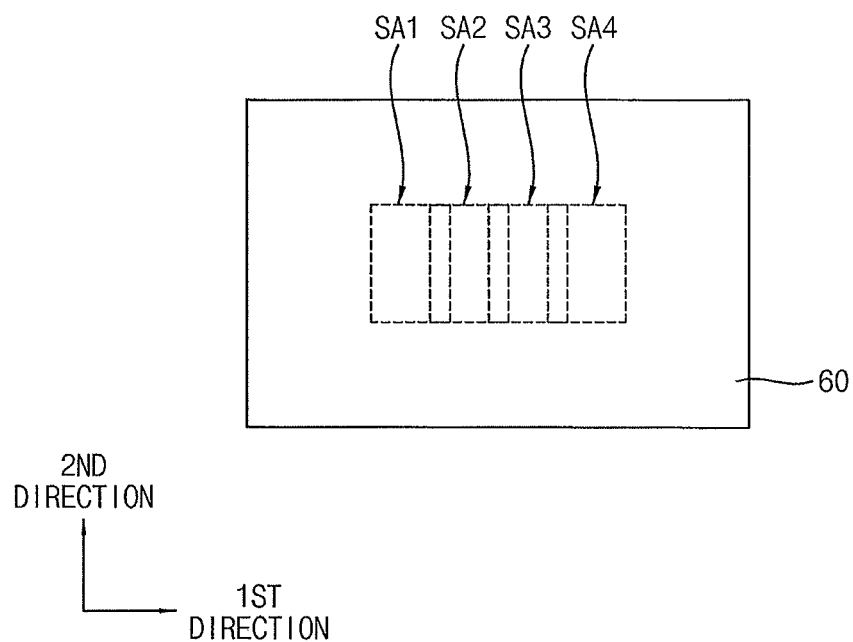
FIGS. 12A, 12B and 12C are top plan views illustrating shot areas of laser shots on a photoresist layer in accordance with example embodiments.
Figure 12B:
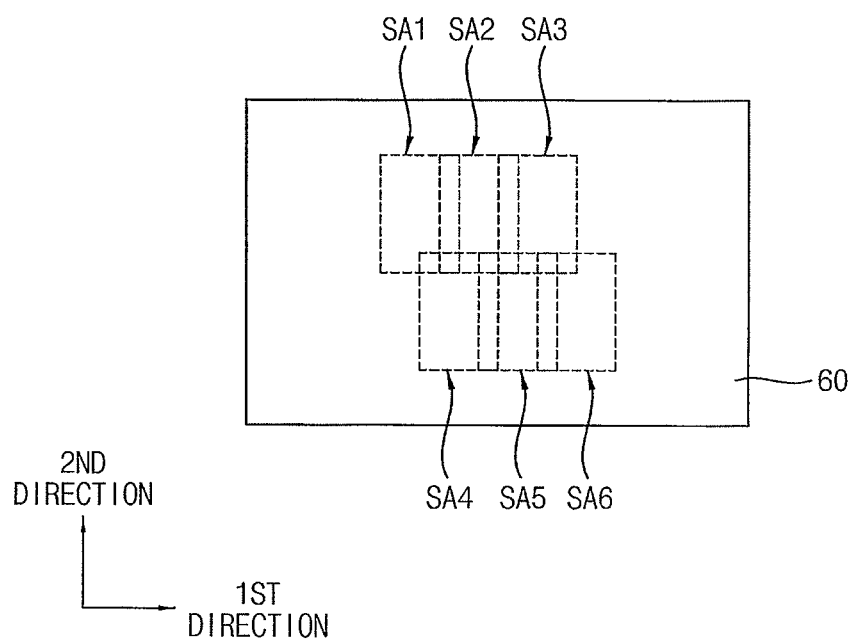
Figure 12C:
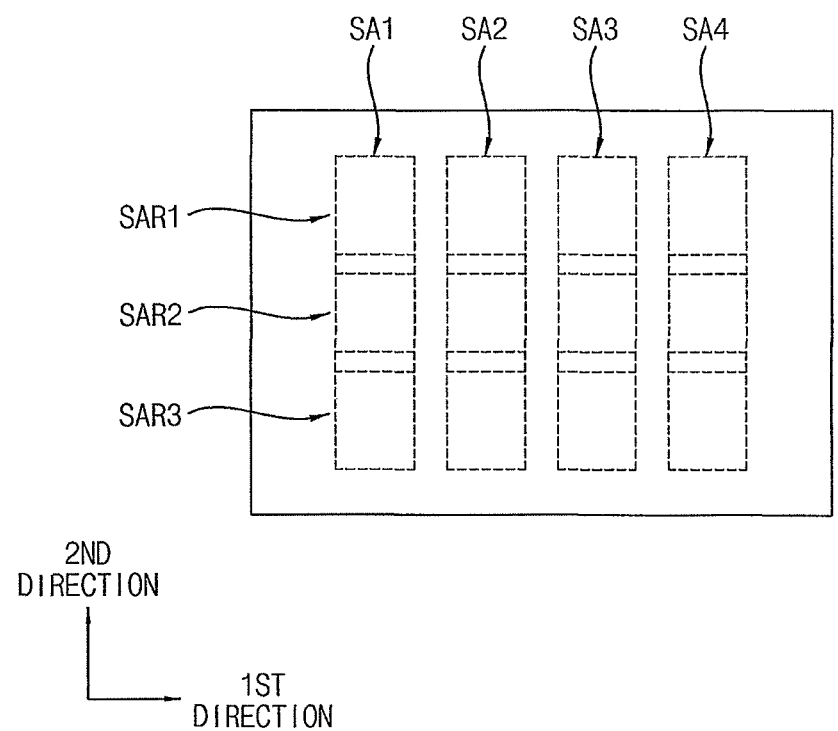

FIG. 11 is a schematic view illustrating an apparatus for irradiating laser shots in accordance with example embodiments. FIGS. 12A, 12B and 12C are top plan views illustrating shot areas of laser shots on a photoresist layer in accordance with example embodiments.

In FIG. 11 and FIGS. 12A to 12C, two directions substantially parallel to a top surface of a substrate and crossing each other are referred to as a first direction and a second direction. For example, the first direction and the second direction are substantially perpendicular to each other.

Referring to FIG. 11, the apparatus may be used for the PEB process as described above. The apparatus may include a stage 10, a supporting bar 20, an irradiation unit 40 and a scanning unit 30.

A substrate 50 on which a photoresist layer 60 is formed may be loaded on the stage 10. In some embodiments, a plurality of the substrates 50 may be loaded on the stage 10. The stage 10 may be movable horizontally, e.g., in the first direction. Thus, the PEB process may be performed concurrently with respect to the plurality of the substrates 50.

The irradiation unit 40 may be placed over the substrate 50 for irradiating laser shots on the photoresist layer 60. The irradiation unit 40 may be coupled to, e.g., an infrared light source. The irradiation unit 40 may include a pellicle, a lens, etc., therein.

The irradiation unit 40 may be movable on the supporting bar 20 by the scanning unit 30. For example, the irradiation unit 40 may be movable in the first direction and/or the second direction while irradiating laser shots on the photoresist layer 60.

Referring to FIG. 12A, the laser shot may be irradiated on the photoresist layer 60 to form a shot area thereon. The shot area may have a square shape or a rectangular shape as represented by a dotted line in FIG. 12A. For example, a plurality of the laser shots may be irradiated along the first direction to form first to fourth shot areas SA1, SA2, SA3 and SA4.

In some embodiments, the shot areas neighboring each other (e.g., SA1 and SA2, SA2 and SA3, SA3 and SA4) may partially overlap each other.

Referring to FIG. 12B, at least three of the laser shots may overlap each other. For example, the shot areas SA1, SA2 and SA4 may partially overlap each other. Additionally, the shot areas SA2, SA3 and SA5 may partially overlap each other.

Referring to FIG. 12C, a plurality of the laser shots may be irradiated along the first direction to form shot areas (e.g., SA1 to SA4). Thus, a shot area row (SAR) may be formed along the first direction. The irradiation unit 40 of the apparatus may be shifted in the second direction, and then the plurality of the laser shots may be irradiated again. Accordingly, a plurality of the shot area rows (e.g., SAR1, SAR2 and SAR3) may be formed along the second direction.

In some embodiments, the shot areas may partially overlap each other in the second direction. For example, as illustrated in FIG. 12C, the shot areas included in different shot area rows may partially overlap in the second direction.

As described above with reference to FIGS. 11, 12A, 12B and 12C, a plurality of the laser shots may be irradiated to overlap each other by, e.g., a scanning method so that the PEB process may be performed uniformly on a desired region of the photoresist layer 60.

FIGS. 13 to 17 are cross-sectional views illustrating a method of forming a photoresist pattern in accordance with an example embodiment.

Detailed descriptions on processes and/or materials substantially the same as or similar to those illustrated with reference to FIGS. 1 to 7 may not be repeated.

Figure 13:
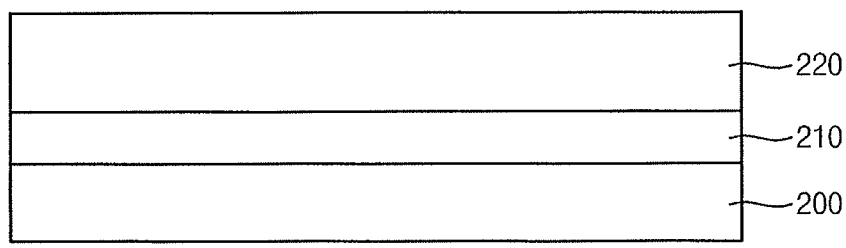
FIGS. 13 to 17 are cross-sectional views illustrating a method of forming a photoresist pattern in accordance with example embodiments.

Referring to FIG. 13, an anti-reflective layer 210 and a photoresist layer 220 may be formed on a substrate 200.

The substrate 200 may be, e.g., a semiconductor wafer including silicon or germanium. In some embodiments, an object layer for an etching process such as an oxide layer may be further formed on the substrate 200.

As described in connection with FIG. 1, the anti-reflective layer 210 and the photoresist layer 220 may be formed using a BARC composition and a photoresist composition, respectively, by, e.g., a spin coating process. A soft-baking process may be performed after coating the BARC composition and after coating the photoresist composition to form the anti-reflective layer 210 and the photoresist layer 220.

In some embodiments, the anti-reflective layer 210 may be formed using an inorganic material such as an inorganic oxide, an inorganic nitride, or an inorganic oxynitride by, e.g., a sputtering process.

Figure 14:
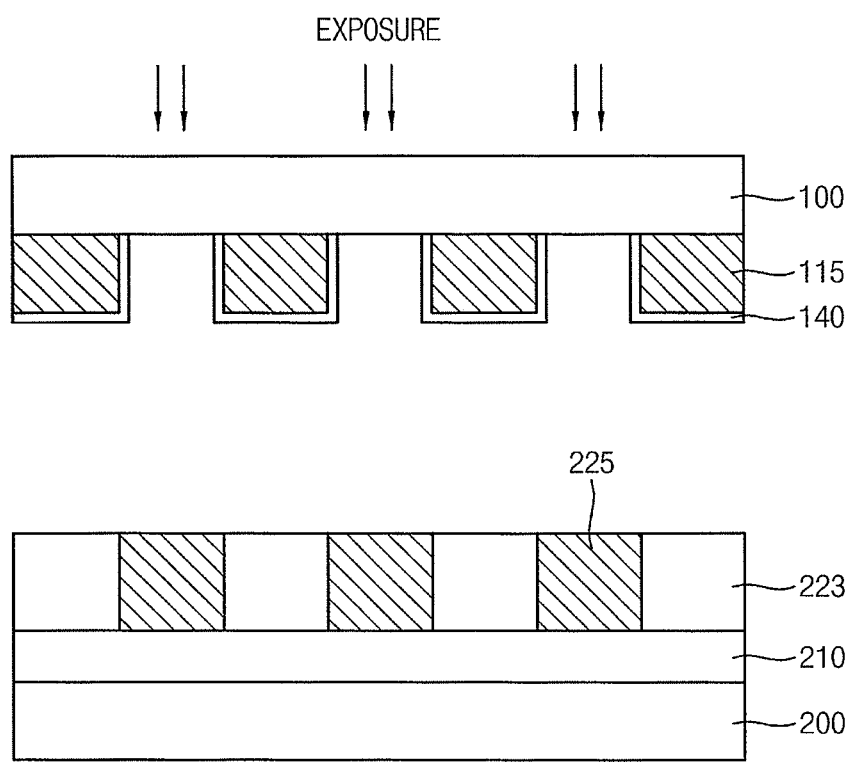

Referring to FIG. 14, an exposure process may be performed on the photoresist layer 220. Accordingly, the photoresist layer 220 may be divided into an exposed portion 225 and a non-exposed portion 223.

In some embodiments, the photomask illustrated with reference to FIGS. 1 to 7 may be utilized for the exposure process as an exposure mask. The exposure mask may include a light-shielding pattern 115 formed on a transparent substrate 100, and a protective layer 140 may be formed on a surface of the light-shielding layer pattern 115. Portions of the transparent substrate 100 between the light-shielding layer patterns 115 neighboring each other may be defined as a transmissive portion.

As described in FIGS. 1 to 7, a photolithography process may be performed for the formation of the light-shielding layer pattern 115, and the photolithography process may include a PEB process using a plurality of laser shots.

In some embodiments, the photolithography process for the formation of the light-shielding layer pattern 115 may include a PEB process using a hot plate.

An acid may be generated from a PAG at the exposed portion 225 during the exposure process.

Figure 15:
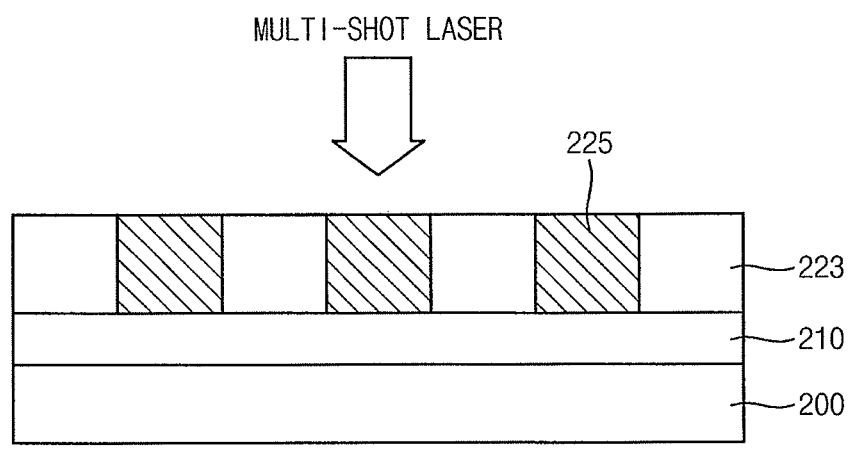

Referring to FIG. 15, a process substantially the same as or similar to that illustrated with reference to FIG. 3 and FIGS. 10A and 10B may be performed.

Accordingly, a PEB process may be performed by a multi-shot laser process, in which a plurality of laser shots may be successively and sequentially irradiated. As described above, variables such as the number of the laser shots, the shot length of each laser shot, a distance (or a time interval) between the neighboring laser shots, and a peak temperature of the each laser shot may be adjusted so that an effective baking time of the PEB process may be controlled. A laser source may be located above the substrate 200 on which the photoresist layer 220 is formed.

The acid may be diffused throughout the exposed portion 225 by the PEB process to activate the exposed portion 225, and a protecting group included in the exposed portion 225 may be separated from a backbone chain of a photoresist material. Further, a damage of the photoresist layer 220 may be prevented while performing the PEB process.

Figure 16:
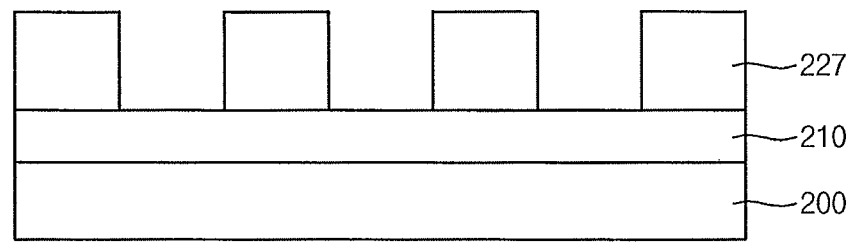

Referring to FIG. 16, a process substantially the same as or similar to that illustrated with reference to FIG. 4 may be performed.

For example, the exposed portion 225 may be selectively removed by a developing process. A photoresist pattern 227 may be defined by the non-exposed portion 223 remaining on the anti-reflective layer 210.

Figure 17:
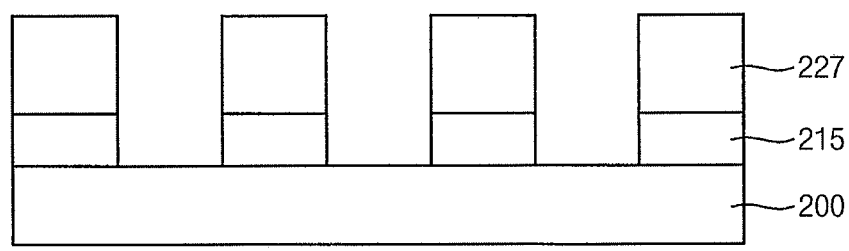

Referring to FIG. 17, the anti-reflective layer 210 may be partially removed using the photoresist pattern 227 as an etching mask. Accordingly, an anti-reflective layer pattern 215 may be formed between the photoresist pattern 227 and the substrate 200.

As described above, the photoresist pattern 227 that may be utilized as an etching mask may be formed on a substrate through the PEB process including the multi-shot laser process.

In some embodiments, the PEB process including the multi-shot laser process may be performed for the formation of both the photoresist pattern 227 and the light-shielding layer pattern 115 of the exposure mask.

In some embodiments, the PEB process including the multi-shot process may be performed for the formation of the light-shielding layer pattern 115. The PEB process for the formation of the photoresist pattern 227 may be performed using a hot plate through a bottom surface of the substrate 200.

In some embodiments, the PEB process using the hot plate may be performed for the formation of the light-shielding layer pattern 115. The PEB process including the multi-shot process may be performed for the formation of the photoresist pattern 227.

FIGS. 18 to 29 are cross-sectional views illustrating a method of manufacturing a semiconductor device in accordance with example embodiments.

Detailed descriptions of processes and/or materials substantially the same as or similar to those illustrated with reference to FIGS. 1 to 7 or FIGS. 13 to 17 may not be repeated.

Figure 18:
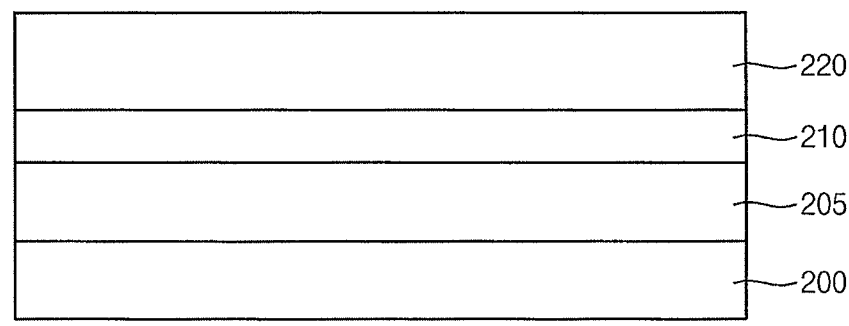
FIGS. 18 to 29 are cross-sectional views illustrating a method of manufacturing a semiconductor device in accordance with example embodiments.

Referring to FIG. 18, a first object layer 205, an anti-reflective layer 210, and a photoresist layer 220 may be sequentially formed on a substrate 200.

The substrate 200 may be prepared from a semiconductor wafer including silicon or germanium. The substrate 200 may include, e.g., a silicon-on-insulator (SOI) substrate or germanium-on-insulator (GOI) substrate.

The first object layer 205 may be a layer for a partial etching process by a photolithography process. In example embodiments, the first object layer 205 may be partially etched by the photolithography process to be converted into a pattern including a plurality of holes or openings extending linearly.

The first object layer 205 may include a silicon oxide-based insulating interlayer material. For example, the first object layer 205 may include plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), or the like.

The first object layer 205 may be formed by, e.g., a CVD process, a plasma enhanced chemical vapor deposition (PECVD) process, an ALD process, or a thermal oxidation process on a top surface of the substrate 200.

The anti-reflective layer 210 and the photoresist layer 220 may be formed using, e.g., a BARC composition and a photoresist composition, respectively, by a spin coating process and a soft-baking process. The soft-baking process may be performed using, e.g., a hot plate.

Figure 19:
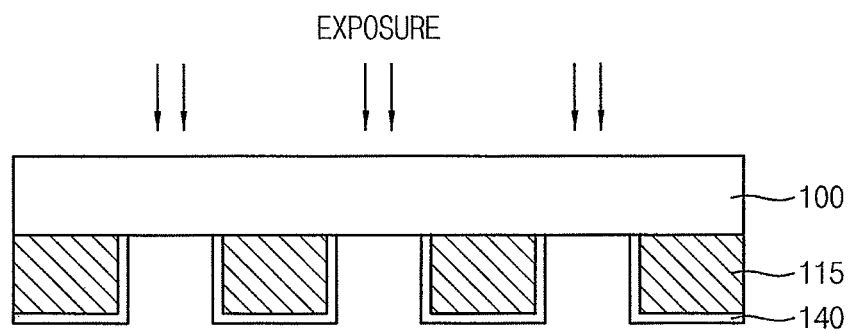

Referring to FIG. 19, a process substantially the same as or similar to that illustrated with reference to FIG. 14 may be performed.

Accordingly, an exposure process may be performed on the photoresist layer using an exposure mask that may include a transparent substrate 100, a light-shielding layer pattern 115, and a protective layer 140. The photoresist layer 220 may be divided into an exposed portion 225 and a non-exposed portion 223 by the exposure process.

The exposure mask may be as illustrated with reference to FIGS. 1 to 7. A PEB process using a plurality of laser shots may be performed for a formation of the light-shielding layer pattern 115.

Figure 20:
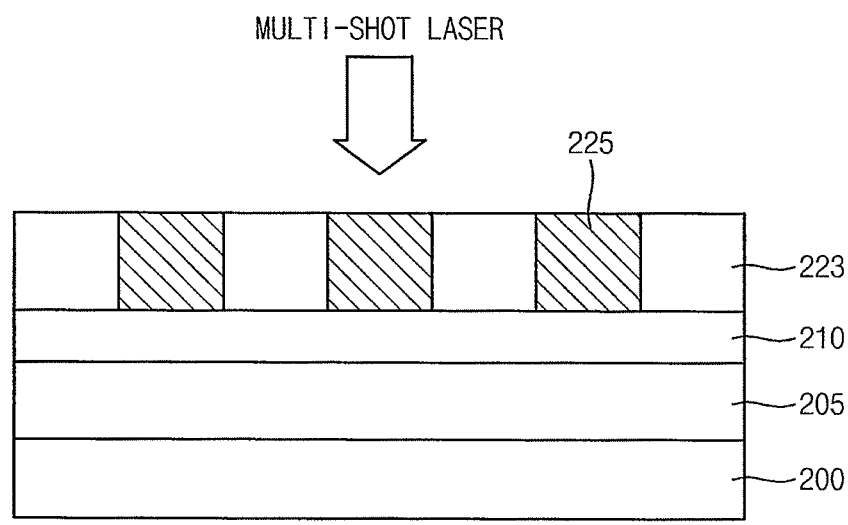

Referring to FIG. 20, a process substantially the same as or similar to that illustrated with reference to FIG. 3, FIGS. 10A and 10B, or FIG. 15 may be performed.

Accordingly, a PEB process including a multi-shot laser process, in which a plurality of laser shots may be successively and sequentially irradiated, may be performed. An acid included in the exposed portion 225 may be diffused by the PEB process so that the exposed portion 225 may be activated while preventing a damage of the photoresist layer 220.

Figure 21:
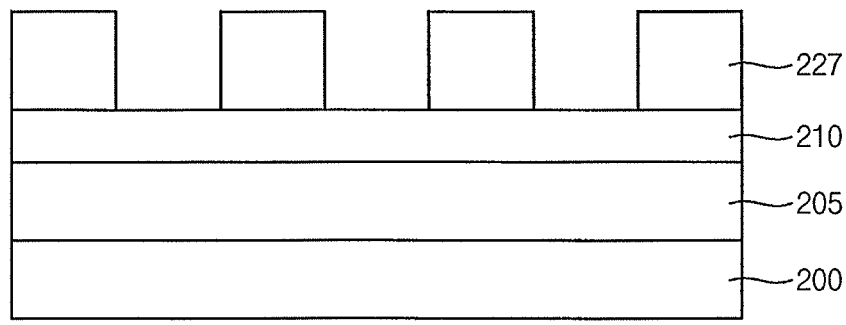

Referring to FIG. 21, the exposed portion 225 may be selectively removed by a developing process. Accordingly, a photoresist pattern 227 may be defined by the remaining non-exposed portion 223. In some embodiments, a hard-baking process may be further performed on, e.g., a hot plate after the formation of the photoresist pattern 227.

Figure 22:
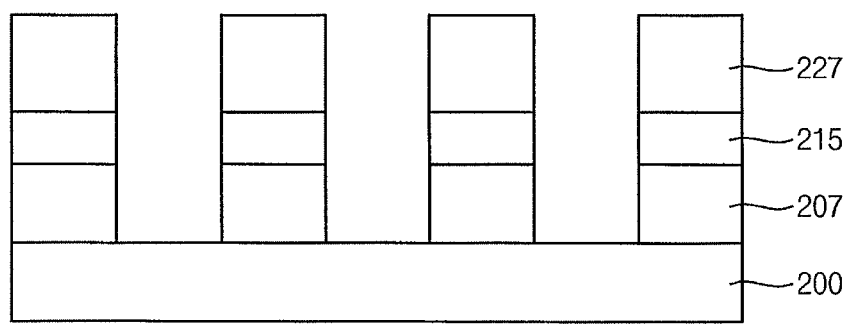

Referring to FIG. 22, the anti-reflective layer 210 may be partially etched using the photoresist pattern 227 to form an anti-reflective layer pattern 215. Accordingly, a mask pattern may be defined by the anti-reflective layer pattern 215 and the photoresist pattern 227, and the mask pattern may include a plurality of the holes through which a top surface of the first object layer 205 may be exposed. In some embodiments, the openings extending linearly and exposing the top surface of the first object layer 205 may be formed between the mask patterns neighboring each other.

The first object layer 205 may be partially etched using the mask pattern. Accordingly, a first object layer pattern 207 including a plurality of contact holes, or linear trenches may be formed. In some embodiments, a top surface of the substrate 200 may be exposed through the contact holes or the trenches.

Figure 23:
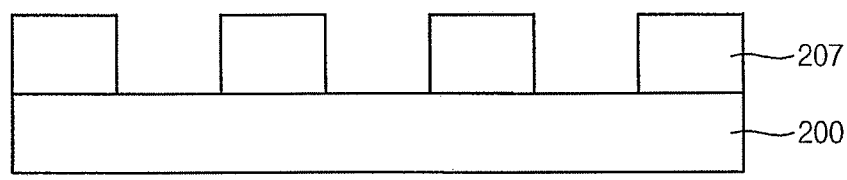

Referring to FIG. 23, the photoresist pattern 227 and the anti-reflective layer pattern 215 may be removed by, e.g., an ashing process and/or a strip process.

Figure 24:
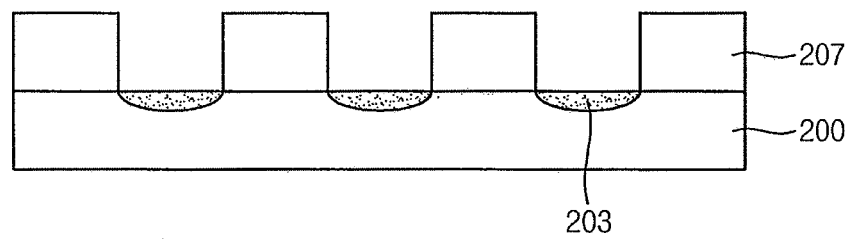

Referring to FIG. 24, n-type or p-type impurities may be implanted at an upper portion of the substrate 200 using the first object layer pattern 207 as an ion-implantation mask. Accordingly, impurity regions 203 may be formed at the upper portion of the substrate 200.

If the first object layer pattern 207 includes the plurality of the contact holes, each of the impurity regions 203 may have an island shape formed at the upper portion of the substrate 200. If the first object layer pattern 207 includes the plurality of the trenches, each of the impurity regions 203 may have a linear shape.

Figure 25:
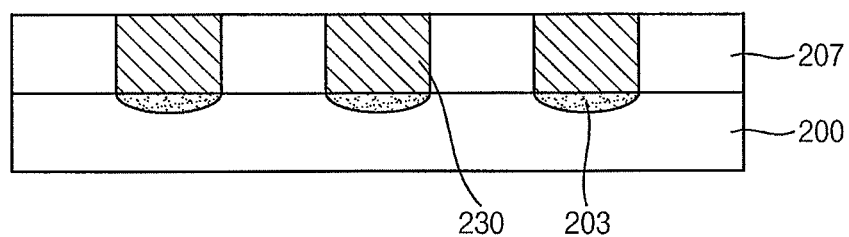

Referring to FIG. 25, a first conductive pattern 230 may be formed in each of the contact holes or the trenches included in the first object layer pattern 207.

In example embodiments, a first conductive layer sufficiently filling the contact holes or the trenches may be formed on the first object layer pattern 207 using a metal such as copper, tungsten, or aluminum. An upper portion of the first conductive layer may be planarized by a chemical mechanical polish (CMP) process until a top surface of the first object layer pattern 207 is exposed to form the first conductive pattern 230.

The first conductive pattern 230 may have a pillar-type contact shape or a wiring shape.

Figure 26:
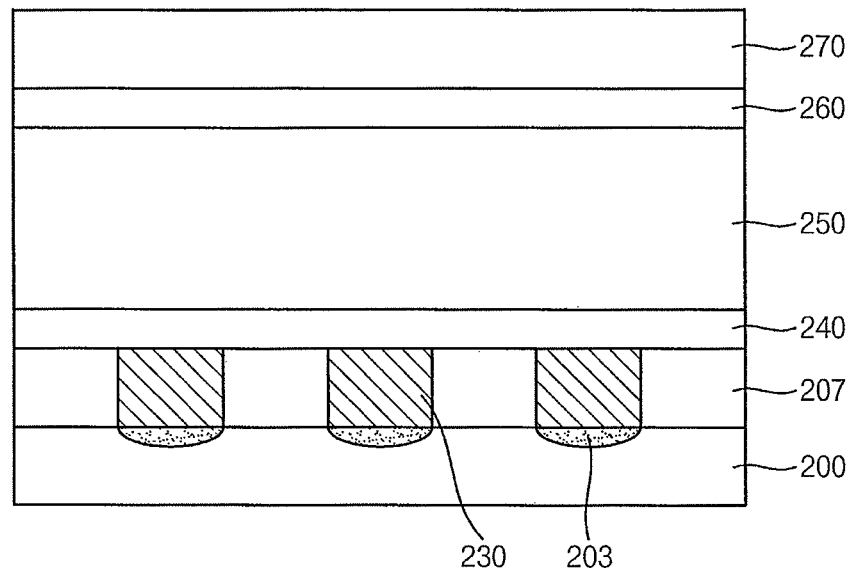

Referring to FIG. 26, an etch-stop layer 240 and a second object layer 250 may be formed on the first object layer pattern 207 and the first conductive layer pattern 230.

The etch-stop layer 240 may be formed of, e.g., silicon nitride or silicon oxynitride. The second object layer 250 may be formed of, e.g., a silicon oxide-based material substantially the same as or similar to that of the first object layer 205.

The etch-stop layer 240 and the second object layer 250 may be formed by, e.g., a CVD process, a PECVD process, or an ALD process.

An upper anti-reflective layer 260 and an upper photoresist layer 270 may be formed on the second object layer 250. The upper anti-reflective layer 260 and the upper photoresist layer 270 may be formed using, e.g., the above-mentioned BARC composition and the photoresist composition, respectively, by a spin coating process, and a soft-baking process on, e.g., a hot plate.

Figure 27:
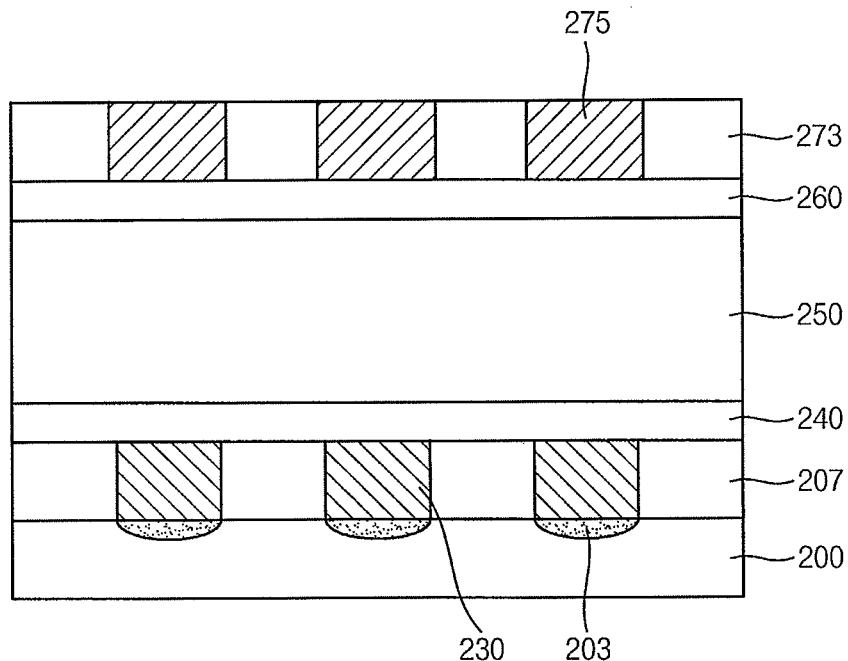

Referring to FIG. 27, processes substantially the same as or similar to those illustrated with reference to FIGS. 19 and 20 may be performed.

Accordingly, the upper photoresist layer 270 may be divided into an exposed portion 275 and a non-exposed portion 273 through an exposure process. For example, the exposure process may be performed using a photomask manufactured by the processes illustrated with reference to FIGS. 1 to 7 as an exposure mask.

Subsequently, a PEB process including a multi-shot laser process may be performed by irradiating a plurality of laser shots successively and sequentially. Accordingly, the exposed portion 275 of the upper photoresist layer 270 may be activated.

Figure 28:
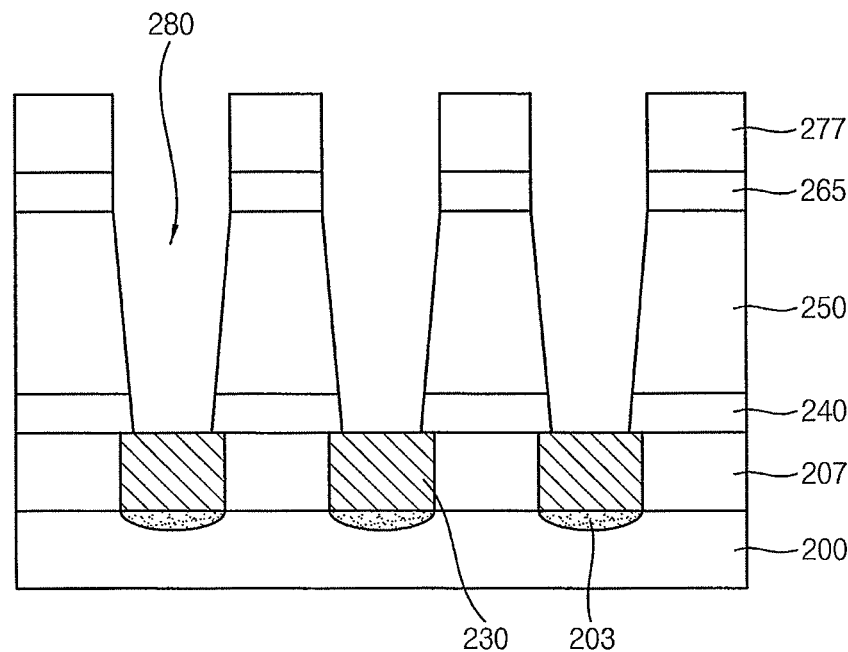

Referring to FIG. 28, the exposed portion 275 may be selectively removed by, e.g., a developing process. Accordingly, an upper photoresist pattern 277 may be defined by the remaining non-exposed portion 273. In some embodiments, a hard-baking process may be further performed on, e.g., a hot plate after the formation of the photoresist pattern 277.

The upper anti-reflective layer 260 may be partially etched using the upper photoresist pattern 277. Accordingly, an upper mask pattern including the upper anti-reflective layer pattern 265 and the upper photoresist pattern 277 may be defined.

Subsequently, the second object layer 250 and the etch-stop layer 240 may be partially etched using the upper mask pattern to form an opening 280.

In some embodiments, top surfaces of a plurality of the first conductive patterns 230 may be exposed through the opening 280. In some embodiments, the opening 280 may have a contact hole shape through which each of the first conductive patterns 230 may be exposed.

After the formation of the opening 280, the upper photoresist pattern 277 and the upper anti-reflective layer pattern 265 may be removed by an ashing process and/or a strip process.

Figure 29:
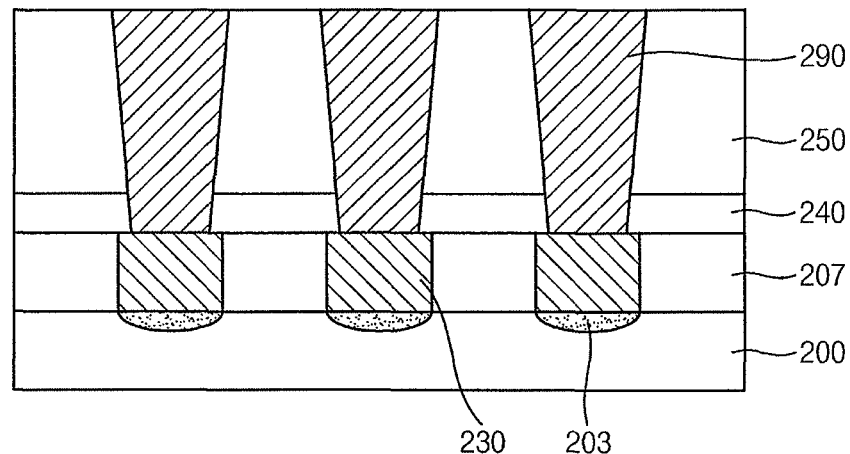

Referring to FIG. 29, a second conductive pattern 290 filling the opening 280 may be formed.

In example embodiments, a second conductive layer filling a plurality of the openings 280 may be formed on the second object layer 250. An upper portion of the second conductive layer may be planarized by, e.g., a CMP process until a top surface of the second object layer 250 is exposed to form the a plurality of the second conductive patterns 290. The second conductive layer may be formed using, e.g., copper, aluminum or tungsten by a sputtering process or an ALD process.

In some embodiments, a barrier conductive layer may be formed conformally on an inner wall of the opening 280 before the formation of the second conductive layer. The barrier conductive layer may be formed of titanium nitride or tantalum nitride.

In some embodiments, the second conductive layer may be formed by a plating process. For example, a seed layer may be formed conformally on the barrier conductive layer by a sputtering process using a copper target. A plating solution containing, e.g., copper sulfate may be used as an electrolyte, and the seed layer and the plating solution may be used as a cathode and an anode, respectively, to apply a current therethrough. Accordingly, the second conductive layer including copper may be precipitated or grown on the seed layer through an electrochemical reaction.

The second conductive pattern 290 may serve as a plug electrically connected to the first conductive pattern 230.

The second conductive pattern 290 may serve as an upper wiring electrically connected to a plurality of the first conductive patterns 230.

In some embodiments, a capping layer covering a top surface of the second conductive pattern 290 may be further formed using a metal such as aluminum or molybdenum.

FIGS. 30 to 44 are top plan views and cross-sectional views illustrating a method of manufacturing a semiconductor device in accordance with example embodiments.

Figure 30:
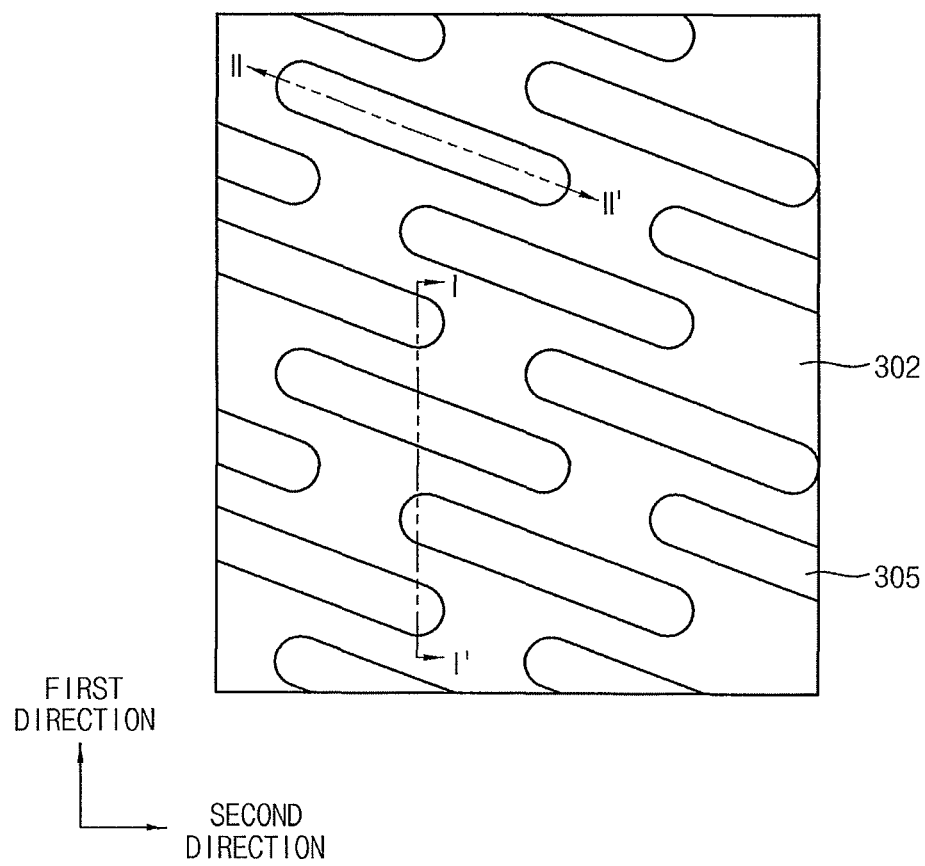
FIGS. 30 to 44 are top plan views and cross-sectional views illustrating a method of manufacturing a semiconductor device in accordance with example embodiments.
Figure 35:
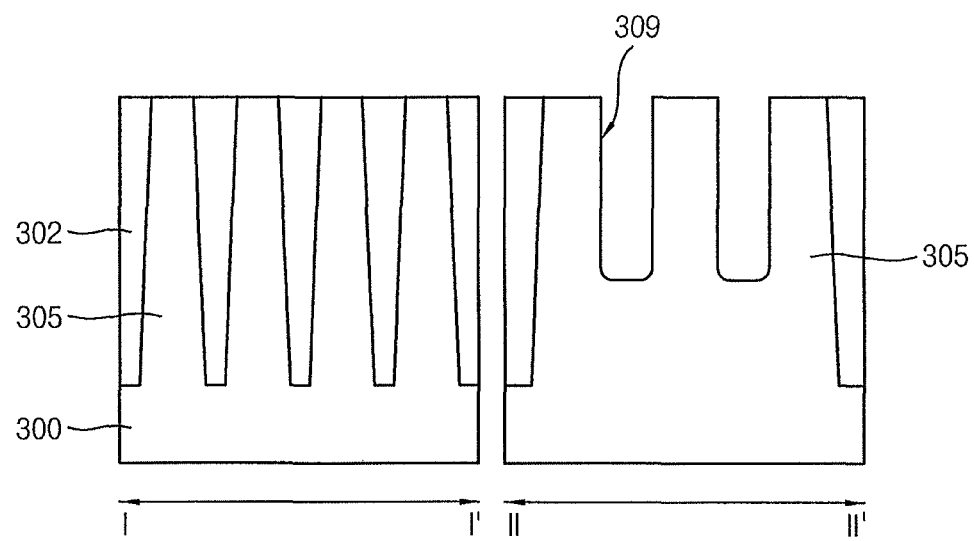
Figure 36:
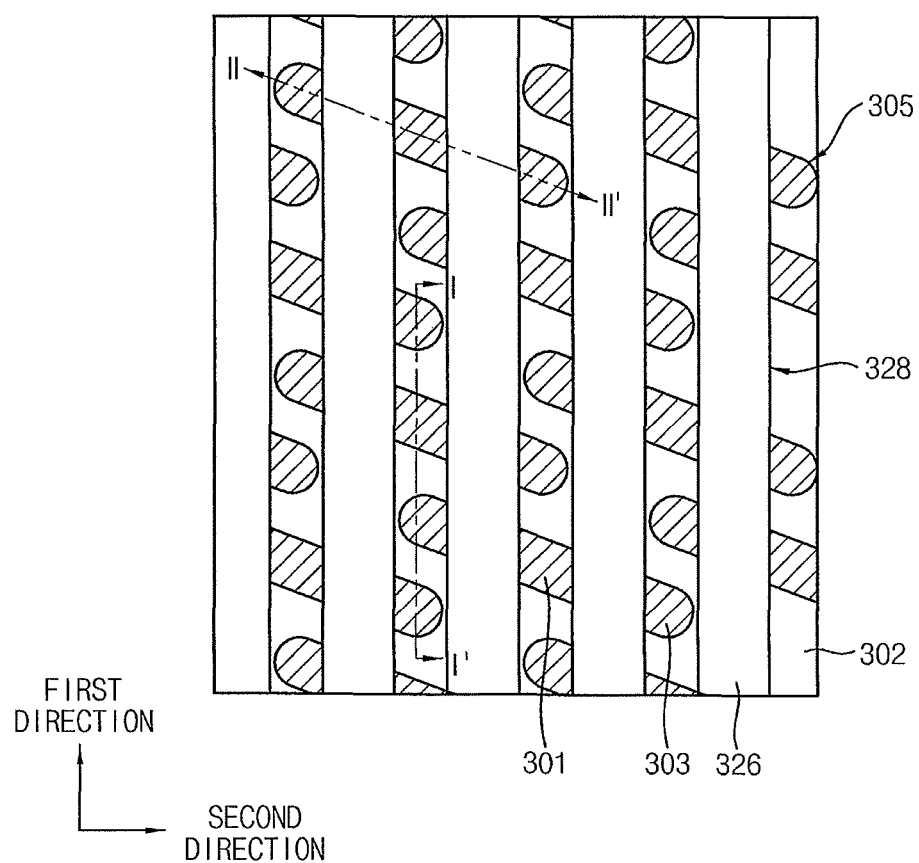
Figure 39:
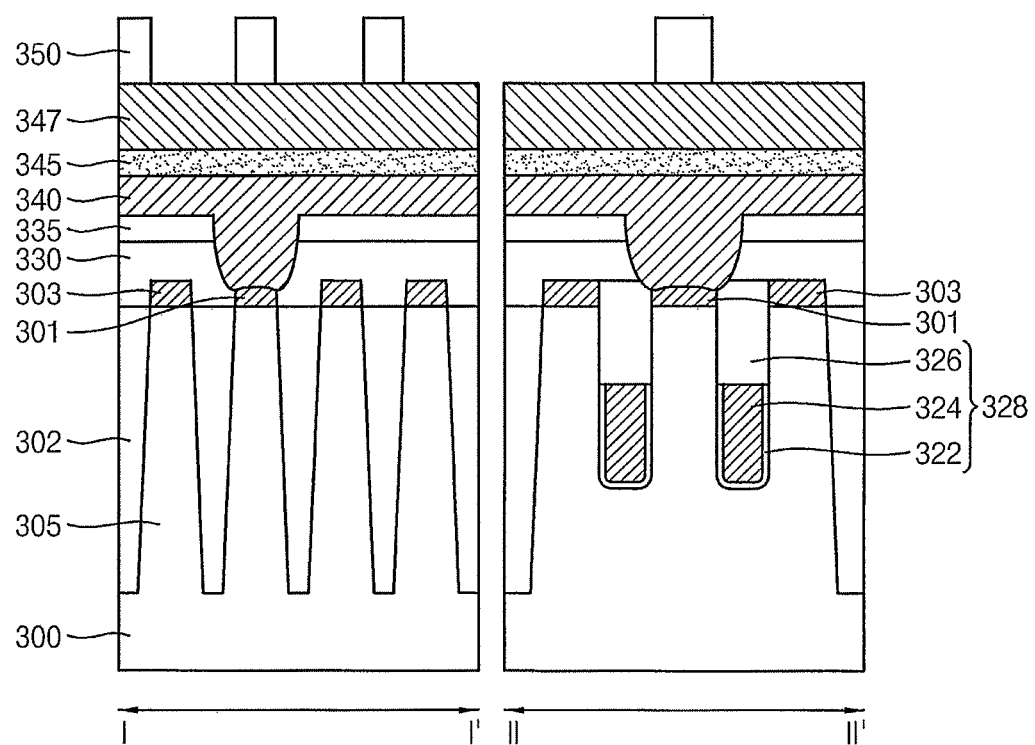
Figure 40:
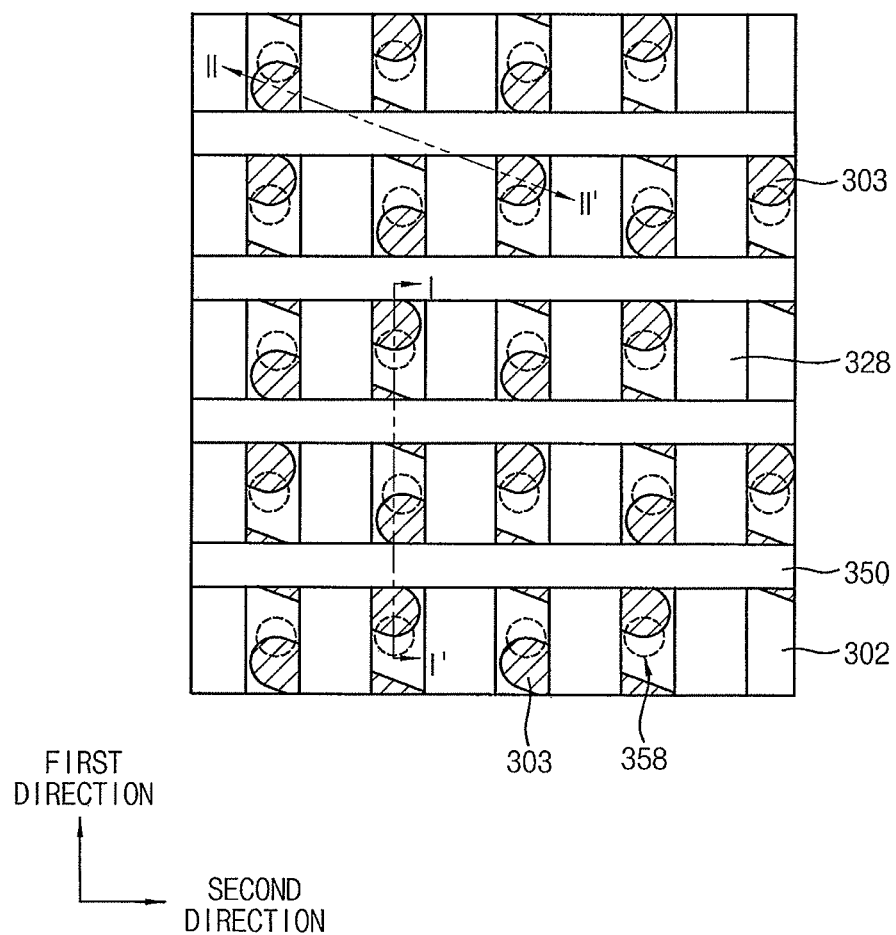

Specifically, FIGS. 30, 36 and 40 are top plan views illustrating the method of manufacturing the semiconductor device. FIGS. 31 to 35, FIGS. 37 to 39, and FIGS. 41 to 44 are cross-sectional views illustrating the method of manufacturing the semiconductor device. Each of FIGS. 31 to 35, FIGS. 37 to 39, and FIGS. 41 to 44 includes sub-cross sectional views taken along lines I-I' and II-II' indicated in FIGS. 30, 36 and 40.

For example, FIGS. 30 to 44 illustrate a method of manufacturing a semiconductor device including a buried cell array transistor (BCAT) structure. Processes and/or materials substantially the same as or similar to those illustrated with reference to FIGS. 1 to 7, FIGS. 10A and 10B, FIGS. 13 to 17, or FIGS. 18 to 29 are omitted herein.

Two directions perpendicular to each other are referred to as a first direction and a second direction. The first and second directions are parallel to a top surface of a substrate. Additionally, a direction indicated by an arrow and a reverse direction thereof are considered to be the same direction.

Figure 31:
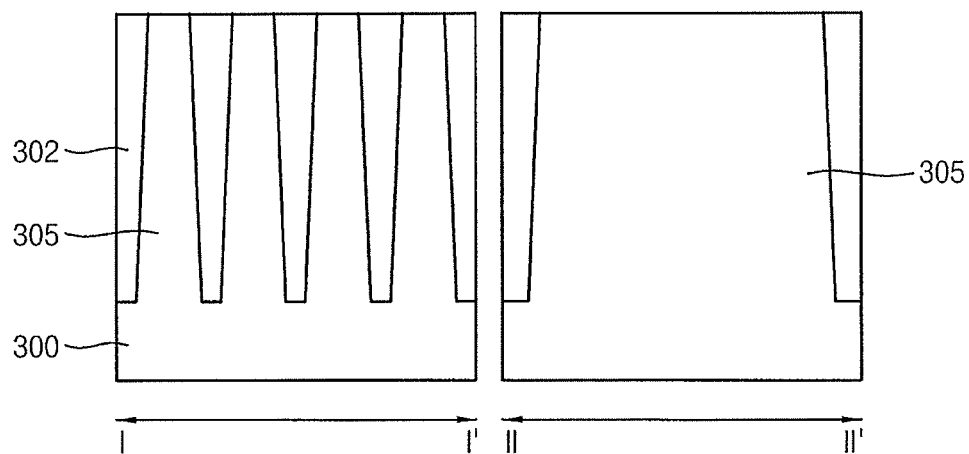

Referring to FIGS. 30 and 31, an isolation layer 302 may be formed on a substrate 300 to define active patterns 305.

The substrate 300 may include silicon, germanium, silicon-germanium, or a group III-V compound such as GaP, GaAs, or GaSb. In some embodiments, the substrate 300 may be an SOI substrate or a GOI substrate.

In example embodiments, the isolation layer 302 and the active pattern 305 may be formed by a shallow trench isolation (STI) process. For example, an upper portion of the substrate 300 may be partially removed by an anisotropic etching process to form an isolation trench. An insulation layer filling the isolation trench and including, e.g., silicon oxide may be formed on the substrate 300. An upper portion of the insulation layer may be planarized by, e.g., a CMP process until a top surface of the substrate 300 is exposed to form the isolation layer 302.

A plurality of the active patterns 305 may be formed to be spaced apart from each other by the isolation layer 302. As illustrated in FIG. 30, each active pattern 305 may extend in a diagonal direction to the first direction or the second direction by a predetermined angle. The plurality of the active patterns 305 may be arranged in the first and second directions.

Figure 32:
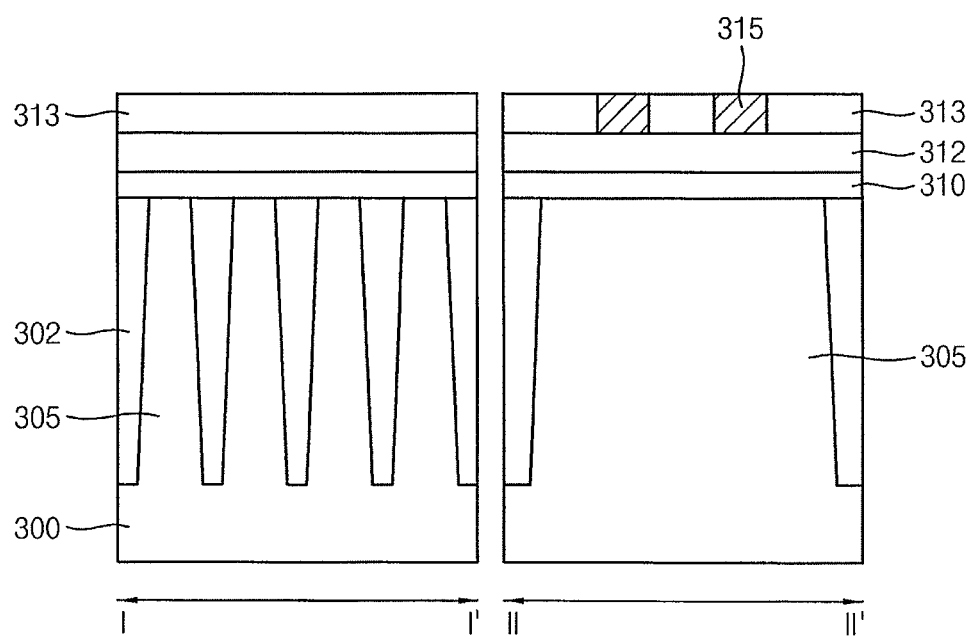

Referring to FIG. 32, an etch-stop layer 310, a mask layer 312 and a photoresist layer may be sequentially formed on the isolation layer 302 and the active patterns 305.

The etch-stop layer 310 may be formed of silicon oxynitride or silicon nitride. The etch-stop layer 310 may also serve as an anti-reflective layer. The mask layer may be formed using a photosensitive organic material, or a silicon-based or carbon-based spin-on hardmask (SOH) material. In some embodiments, at least one of the etch-stop layer 310 and the mask layer 312 may be omitted.

The photoresist layer may be formed by processes substantially the same as or similar to those illustrated with reference to FIGS. 1 and 13.

An exposure process substantially the same as or similar to that illustrated with reference to FIG. 14 or FIG. 19 may be performed on the photoresist layer. The photoresist layer may be divided into an exposed portion 315 and a non-exposed portion 313.

In some embodiments, a photomask manufactured as illustrated in FIGS. 1 to 7 may be employed for the exposure process.

Figure 33:
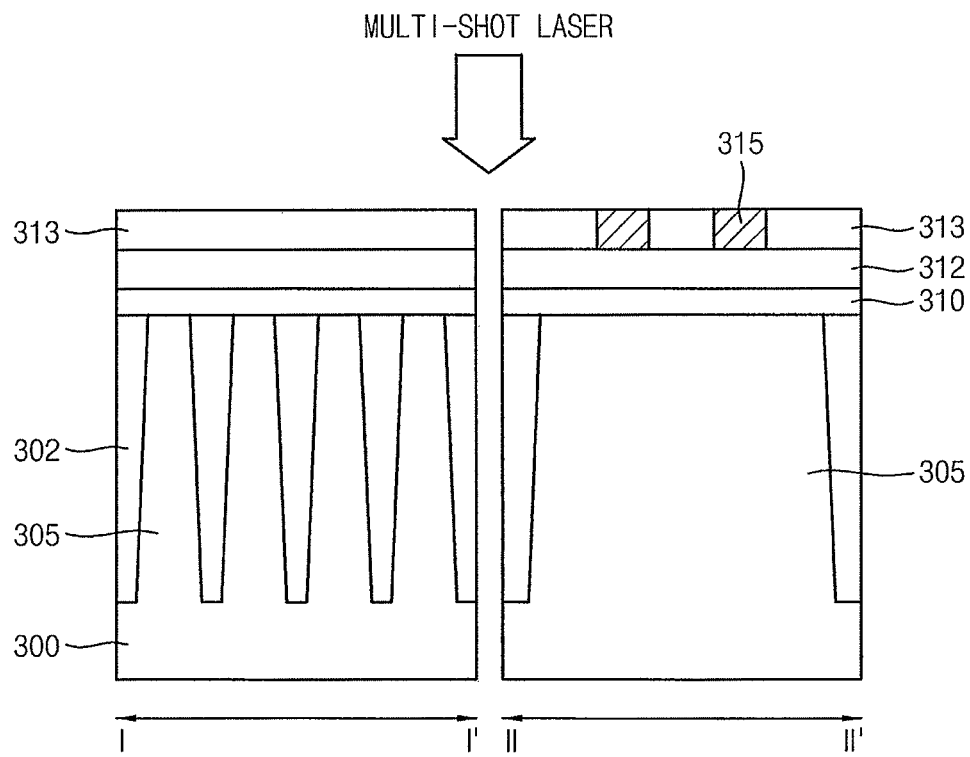

Referring to FIG. 33, a process substantially the same as or similar to that illustrated with reference to FIG. 3, FIGS. 10A and 10B, FIG. 15 or FIG. 20 may be performed.

Accordingly, a PEB process including a multi-shot laser process may be performed by irradiating a plurality of laser shots successively and sequentially. An acid included in the exposed portion 315 may be diffused by the PEB process so that the exposed portion 315 may be activated while preventing a damage of the photoresist layer.

Figure 34:
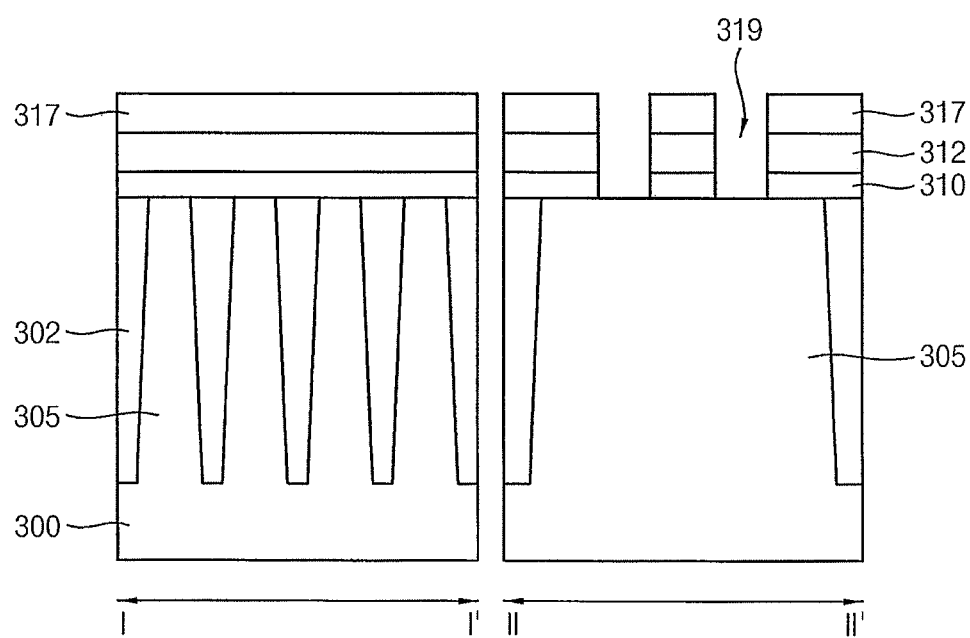

Referring to FIG. 34, the exposed portion 315 may be selectively removed by, e.g., a developing process. Accordingly, a photoresist pattern 317 may be defined on the mask layer 312 by the remaining non-exposed portion 313.

The mask layer 312 and the etch-stop layer 310 may be sequentially etched using the photoresist pattern 317 as an etching mask. Accordingly, an opening 319 through which a top surface of the active pattern 305 is exposed may be formed.

In example embodiments, the opening 319 may extend in the first direction, and may expose top surfaces of the active patterns 305 and the isolation layer 302. A plurality of the openings 319 may be formed along the second direction. In some embodiments, two of the openings 319 may extend on one of the active patterns 305.

Referring to FIG. 35, upper portions of the active patterns 305 and the isolation layer 302 may be etched through the opening 319 to form a gate trench 309.

The gate trenches 309 may be formed to have an arrangement substantially comparable to that of the openings 319. For example, the gate trench 309 may extend in the first direction, and a plurality of the gate trenches 309 may be formed along the second direction. In some embodiments, two of the gate trenches 309 may be formed at one of the active patterns 305.

In some embodiments, the opening 319 and the gate trench 309 may be formed by a substantially the same etching process, e.g., an in-situ etching process. In this case, the photoresist pattern 317, the mask layer 312, and the etch-stop layer 310 may be removed by, e.g., a CMP process after the formation of the gate trench 309.

In some embodiments, the opening 319 and the gate trench 309 may be formed by separate etching processes, e.g., ex-situ etching processes. For example, the photoresist pattern 317 may be removed by an ashing process and/or a strip process after the formation of the opening 319. An additional etching process may be performed to form the gate trench 309, and then the mask layer 312 and the etch-stop layer 310 may be removed by a CMP process.

Figure 37:
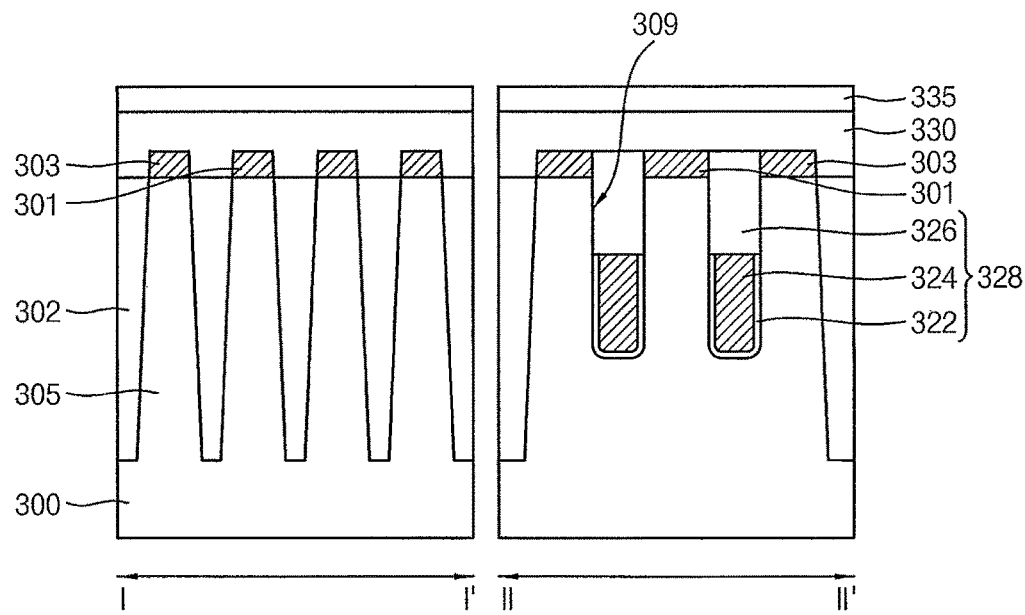

Referring to FIGS. 36 and 37, a gate structure 328 filling the gate trench 309 and extending in the gate trench 309 may be formed.

In example embodiments, a gate insulation layer may be formed on the active pattern 305 and an inner wall of the gate trench 309 by a thermal oxidation process or by depositing silicon oxide or a metal oxide through, e.g., a CVD process.

A gate conductive layer filling a remaining portion of the gate trench 309 may be formed on the gate insulation layer. The gate conductive layer may be planarized by a CMP process until the top surface of the active pattern 305 is exposed, and upper portions of the gate insulation layer and the gate conductive layer may be removed by an etch-back process. Accordingly, a gate insulation layer pattern 322 and a gate electrode 324 filling a lower portion of the gate trench 309 may be formed.

The gate conductive layer may be formed using a metal and/or a metal nitride by an ALD process or a sputtering process.

A mask layer filling a remaining portion of the gate trench 309 may be formed on the gate insulation layer pattern 322 and the gate electrode 324, and an upper portion of the mask layer may be planarized until the top surface of the active pattern 305 is exposed to form a gate mask 326. The mask layer may be formed of silicon nitride by, e.g., a CVD process.

Accordingly, the gate structure 328 including the gate insulation layer pattern 322, the gate electrode 324 and the gate mask 326 that are sequentially stacked in the gate trench 309 may be formed.

According to an arrangement of the gate trenches 309, a plurality of the gate structures 328 may be formed to be arranged along the second direction and each gate structure 328 may extend in the first direction. The gate structure 328 may be buried or embedded in an upper portion of the active pattern 305. An upper portion of the active pattern 305 may be divided into a central portion between two gate structures 328, and a peripheral portion (or end portions) facing the central portion with respect to each of the gate structure 328.

An ion-implantation process may be performed to form a first impurity region 301 and a second impurity region 303 at portions of the active pattern 305 adjacent to the gate structures 328. For example, the first impurity region 301 may be formed at the central portion of the active pattern 305, and the second impurity region 303 may be formed at the peripheral portions of the active pattern 305.

In some embodiments, as illustrated in FIG. 37, an upper portion of the isolation layer 302 may be recessed by an etch-back process such that the upper portion of the active pattern 305 is exposed. Subsequently, the ion-implantation process may be performed to form the first and second impurity regions 301 and 303.

A capping layer 330 covering the active patterns 305 and the isolation layer 302 may be formed, and a first insulating interlayer 335 may be formed on the capping layer 330. For example, the capping layer 330 and the first insulating interlayer 335 may be formed of silicon nitride and silicon oxide, respectively. The capping layer 330 may substantially serve as an etch-stop layer during subsequent etching processes.

Figure 38:
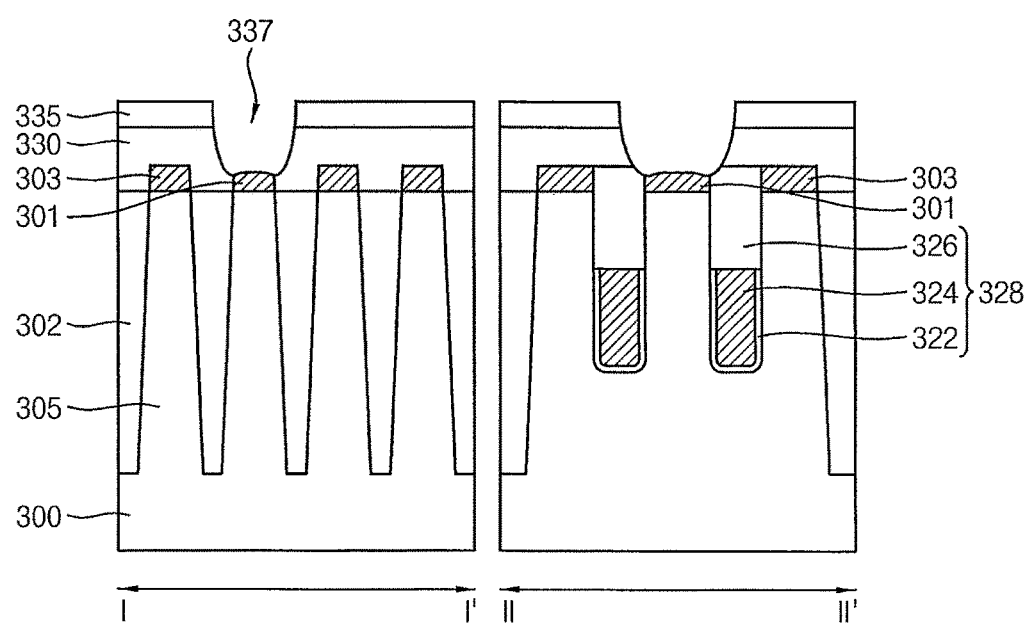

Referring to FIG. 38, the first insulating interlayer 335 and the capping layer 330 may be sequentially and partially etched to form a groove 337 through which the first impurity regions 301 may be exposed. The groove 337 may extend in the second direction indicated in FIG. 36, and a plurality of the grooves 337 may be formed to be arranged along the first direction.

In some embodiments, an upper portion of the first impurity region 301 may be partially removed during the etching process for the formation of the groove 337. Accordingly, a height difference between the first and second impurity regions 301 and 303, and thus a bridge or a short circuit between a conductive line structure 355 and a conductive contact 375 (see FIG. 44) formed by subsequent processes may be prevented.

Referring to FIG. 39, a first conductive layer 340 filling the groove 337 may be formed on the first insulating interlayer 335. A barrier conductive layer 345 and a second conductive layer 347 may be sequentially formed on the first conductive layer 340, and a mask pattern 350 may be formed on the second conductive layer 347.

For example, the first conductive layer 340 may be formed using doped polysilicon, the barrier conductive layer 345 may be formed of a metal nitride or a metal silicide, and the second conductive layer 347 may be formed using a metal. The first conductive layer 340, the barrier conductive layer 345 and the second conductive layer 347 may be formed by, e.g., a sputtering process, a PVD process, CVD process, or an ALD process.

The mask pattern 350 may include, e.g., silicon nitride, and may extend in the second direction. A width of the mask pattern 350 (e.g., a width in the first direction) may be smaller than that of the groove 337.

In some embodiments, the mask pattern 350 may be formed by a photolithography process including a PEB process in which a multi-shot laser may be utilized.

For example, a mask layer and a photoresist layer may be formed on the second conductive layer 347. The photoresist layer may be exposed to light through an exposure mask including transmissive portions extending linearly in the second direction. The exposure mask may be manufactured by processes substantially the same as or similar to those illustrated with reference to FIGS. 1 to 7.

An exposed portion of the photoresist layer may be activated by the PEB process. The exposed portion may be removed by a developing process to form a photoresist pattern, and the mask layer may be etched using the photoresist pattern to form a plurality of the mask patterns 350. The mask pattern 350 may extend in the first direction.

Figure 41:
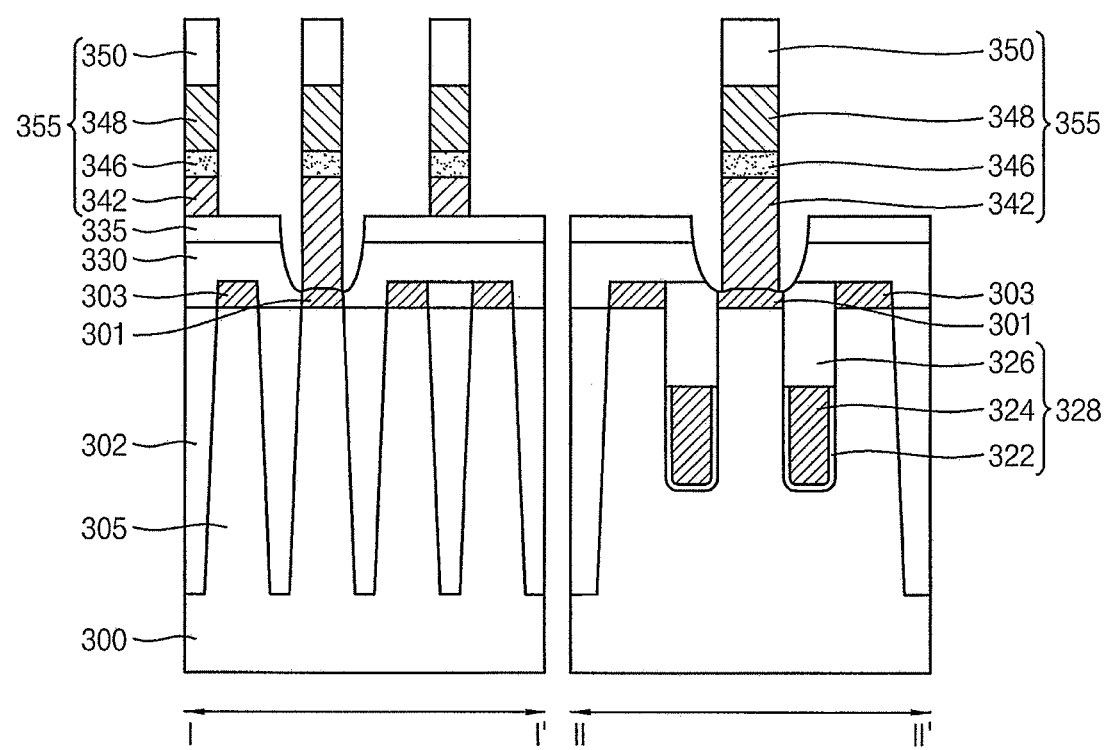

Referring to FIGS. 40 and 41, the second conductive layer 347, the barrier conductive layer 345, and the first conductive layer 340 may be sequentially etched using the mask pattern 350 as an etching mask. Accordingly, a first conductive layer pattern 342, a barrier conductive layer pattern 346 and a second conductive layer pattern 348 may be sequentially formed on the first impurity region 301. For convenience of descriptions, illustrations of the first insulating interlayer 335 and the capping layer 330 are omitted in FIG. 40.

Accordingly, the conductive line structure 355 including the first conductive layer pattern 342, the barrier conductive layer pattern 346, the second conductive layer pattern 348 and the mask pattern 350 may be formed. The conductive line structure 355 may extend in the second direction on the first impurity region 301. In example embodiments, the conductive line structure 355 may serve as a bit line.

In some embodiments, the conductive line structure 355 may have a narrower width that that of the groove 337. Thus, a sidewall of the conductive line structure 355 may be spaced apart from a sidewall of the groove 337.

Figure 42:
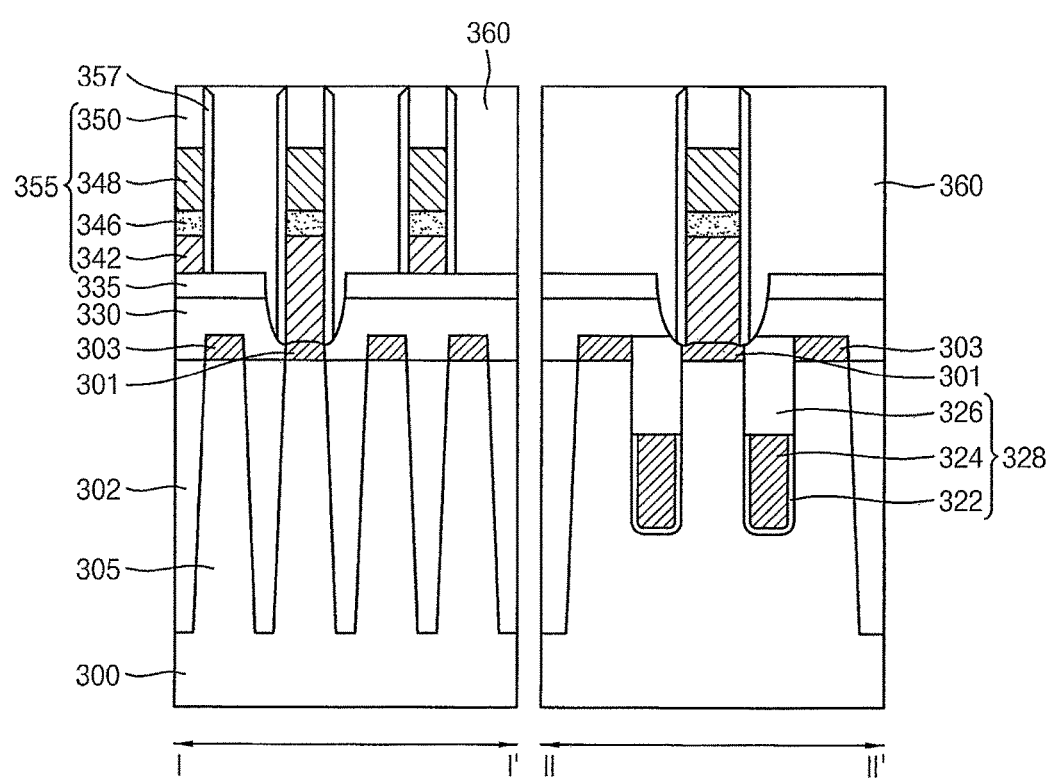

Referring to FIG. 42, a spacer 357 may be formed on the sidewall of the conductive line structure 355. For example, a spacer layer covering the conductive line structure 355 may be formed on the first insulating interlayer 335. The spacer layer may be anisotropically etched to form the spacer 357. The spacer layer may be formed of, e.g., silicon nitride.

A second insulating interlayer 360 covering the conductive line structure 355 may be formed on the first insulating interlayer 335. The second insulating interlayer 360 may fill a remaining portion of the groove 337.

In some embodiments, an upper portion of the second insulating interlayer 360 may be planarized by a CMP process such that a top surface of the mask pattern 350 may be exposed. The second insulating interlayer 360 may be formed of silicon oxide substantially the same as or similar to that of the first insulating interlayer 335.

Figure 43:
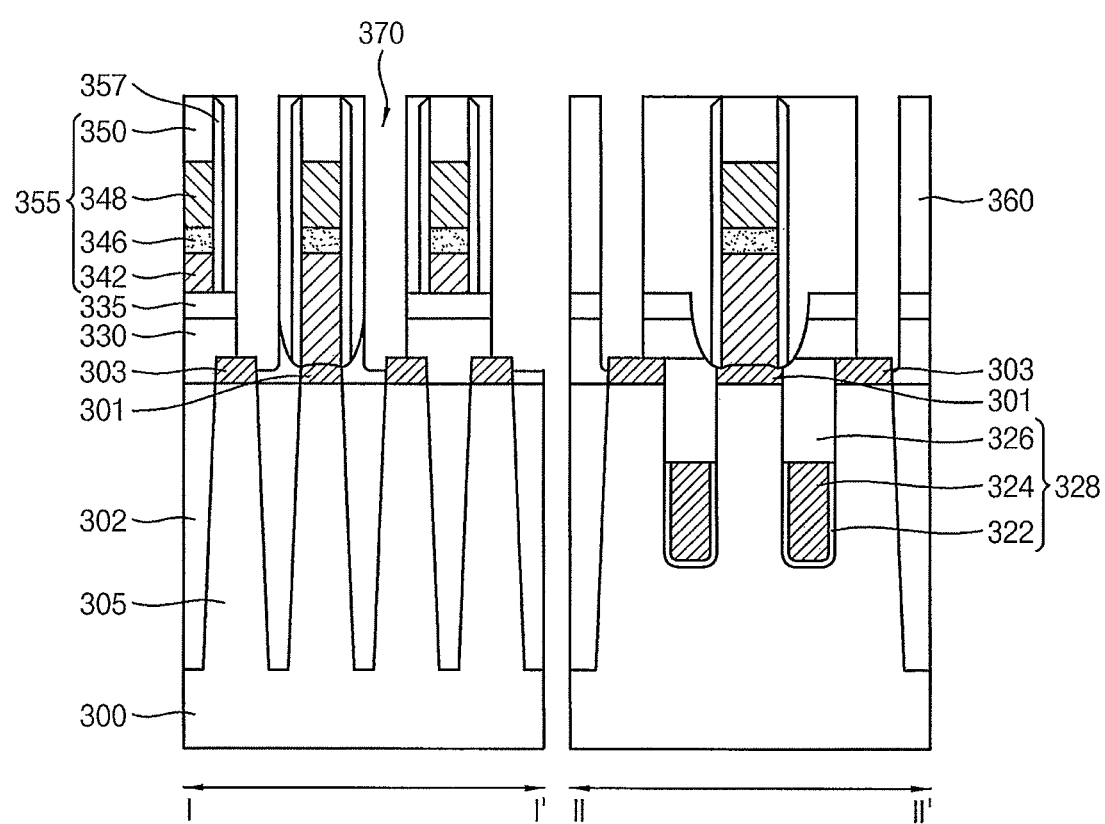

Referring to FIG. 43, the second insulating interlayer 360, the first insulating interlayer 335 and the capping layer 330 may be partially etched to form a contact hole 370 through which the second impurity region 303 may be exposed. The contact hole 370 may be formed per each of hole formation areas 358 indicated in FIG. 40.

In some embodiments, the contact hole 370 may be formed by a photolithography process including a multi-shot laser PEB process according to example embodiments with respect to the second insulating interlayer 360.

Figure 44:
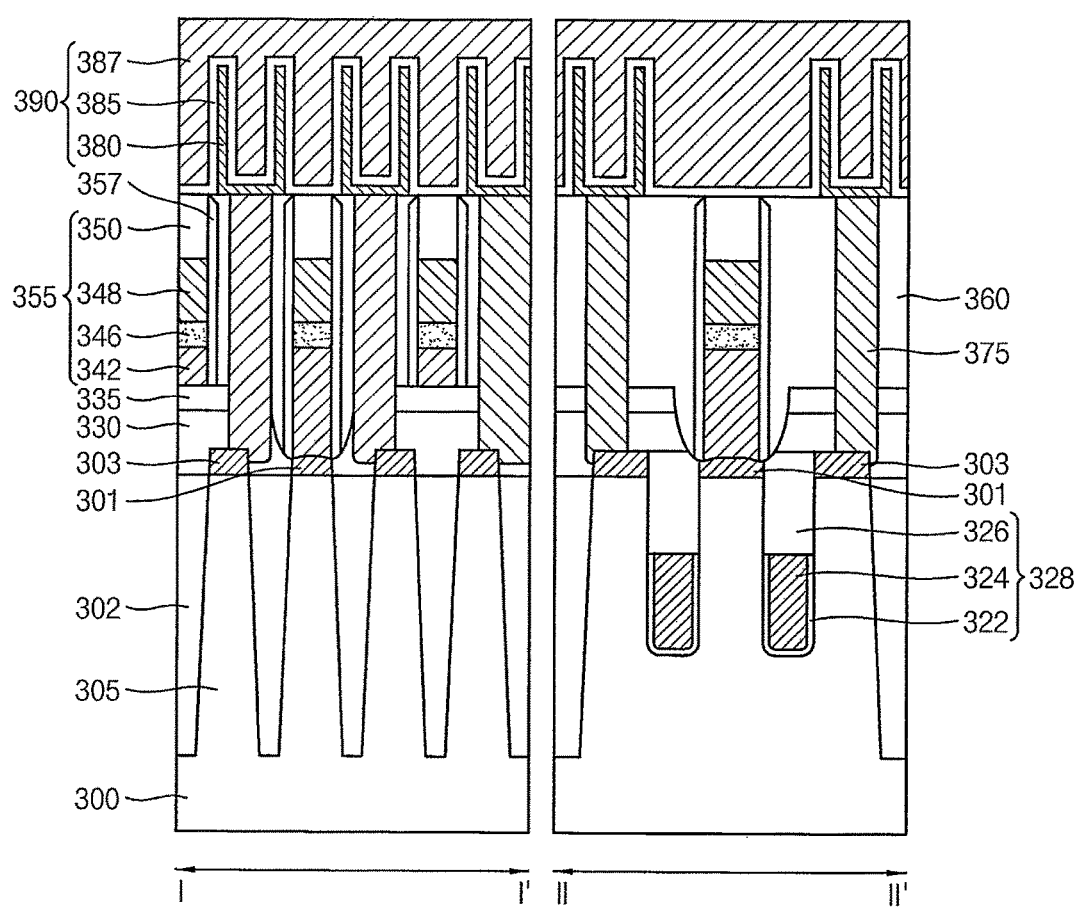

Referring to FIG. 44, the conductive contact 375 filling the contact hole 370 and electrically connected to the second impurity region 303 may be formed. For example, a capacitor 390 may be formed on the conductive contact 375. In this case, the conductive contact 375 may serve as a capacitor contact.

For example, a conductive layer filling the contact holes 370 may be formed, and an upper portion of the conductive layer may be planarized by a CMP process until the top surface of the mask pattern 350 is exposed. Accordingly, the conductive contact 375 may be formed in each contact hole 370, and may be in contact with the second impurity region 303.

The conductive layer may be formed using a metal such as copper or tungsten by, e.g., a sputtering process, a PVD process, an ALD process, or a CVD process. In some embodiments, the conductive layer may be formed by an electroplating process or an electroless plating process. In some embodiments, a barrier conductive layer including, e.g., titanium or titanium nitride may be formed on an inner wall of the contact hole 370 before forming the conductive layer.

The capacitor 390 electrically connected to the conductive contact 375 may be formed. Thus, a dynamic random access memory (DRAM) device having the BCAT structure may be achieved.

For example, an etch-stop layer and a mold layer (not illustrated) may be formed on the mask pattern 350, the second insulating interlayer 360, and the conductive contact 375. The mold layer and the etch-stop layer may be partially removed to form an opening through which a top surface of the conductive contact 375 is exposed.

A lower electrode layer may be formed along an inner wall of the opening and a top surface of the mold layer. The lower electrode layer may be formed of a metal or a metal nitride. For example, the lower electrode layer may be formed of at least one of tungsten, tungsten nitride, titanium, titanium nitride, tantalum, tantalum nitride, and/or ruthenium. A sacrificial layer (not illustrated) may be formed on the lower electrode layer, and upper portions of the sacrificial layer and the lower electrode layer may be planarized such that the top surface of the mold layer is exposed. The sacrificial layer and the mold layer may be removed to form a lower electrode 380.

A dielectric layer 385 may be formed on surfaces of the etch-stop layer and the lower electrode 380, and an upper electrode 387 may be formed on the dielectric layer 385 to form the capacitor 390. The dielectric layer 385 may be formed of silicon oxide or a metal oxide having a high dielectric constant. The upper electrode 387 may be formed of a metal or a metal nitride substantially the same as or similar to that of the lower electrode 380.

In some embodiments, a magnetic tunnel junction (MTJ) structure may be formed on the conductive contact 375. In this case, the semiconductor device may serve as a magnetic random access memory (MRAM) device having the BCAT structure.

For example, a fixed layer, a tunnel barrier layer, and a tunnel barrier layer interposed therebetween may be formed on the mask pattern 350, the second insulating interlayer 360, and the conductive contact 375. The fixed layer and the free layer may be formed of a magnetic material. The tunnel barrier layer may be formed of, e.g., at least one of magnesium oxide, titanium oxide, aluminum oxide, magnesium zinc oxide and magnesium boron oxide.

The free layer, the tunnel barrier layer, and the fixed layer may be partially etched to form the MTJ structure on each conductive contact 375. In some embodiments, the etching process for the free layer, the tunnel barrier layer, and the fixed layer may include a photolithography process in which a multi-shot laser PEB process according to example embodiments may be performed.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXPERIMENTAL EXAMPLE

Evaluations on a Removal of a Photoresist after a PEB Process

A photoresist layer having a thickness of 100 nm was formed on a silicon wafer using a commercially available positive-type photoresist material. The photoresist layer was exposed to light, a PEB process was performed using a light source, a wavelength of which was 980 nm, and then a developing process was performed using a TMAH solution. A thickness of the photoresist layer remaining after the developing process was measured.

Figure 45:
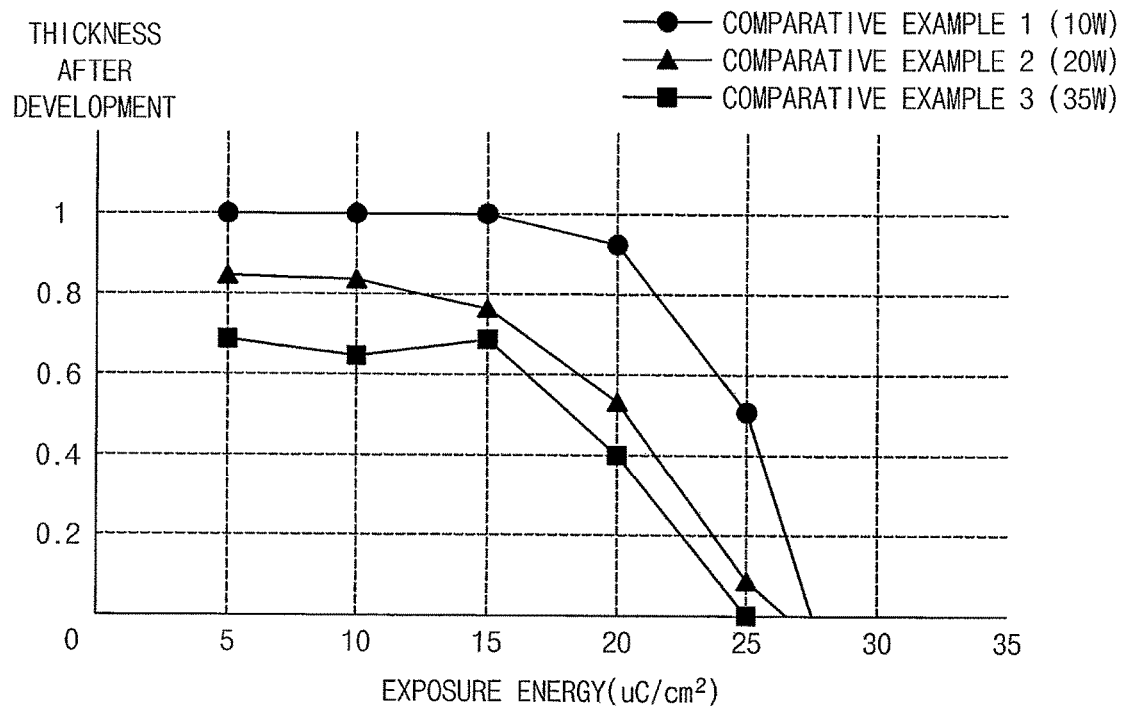
FIG. 45 is a graph showing a thickness change of a photoresist layer after a PEB process and a developing process in accordance with Comparative Examples.

FIG. 45 is a graph showing a thickness change of a photoresist layer after a PEB process and a developing process in accordance with Comparative Examples.

In Comparative Examples 1 to 3, a single laser shot was irradiated, varying a power of a laser source while performing the PEB process. In FIG. 45, the X-axis indicates a change of an exposure energy, and the Y-axis indicates a relative thickness of the remaining photoresist layer after the developing process with respect to an initial thickness of the photoresist layer.

Referring to FIG. 45, as shown in graphs of Comparative Examples 1 to 3, a removal amount of the photoresist layer was widely distributed according to the change of the exposure energy when the developing process was performed after the single laser shot PEB process.

Figure 46:
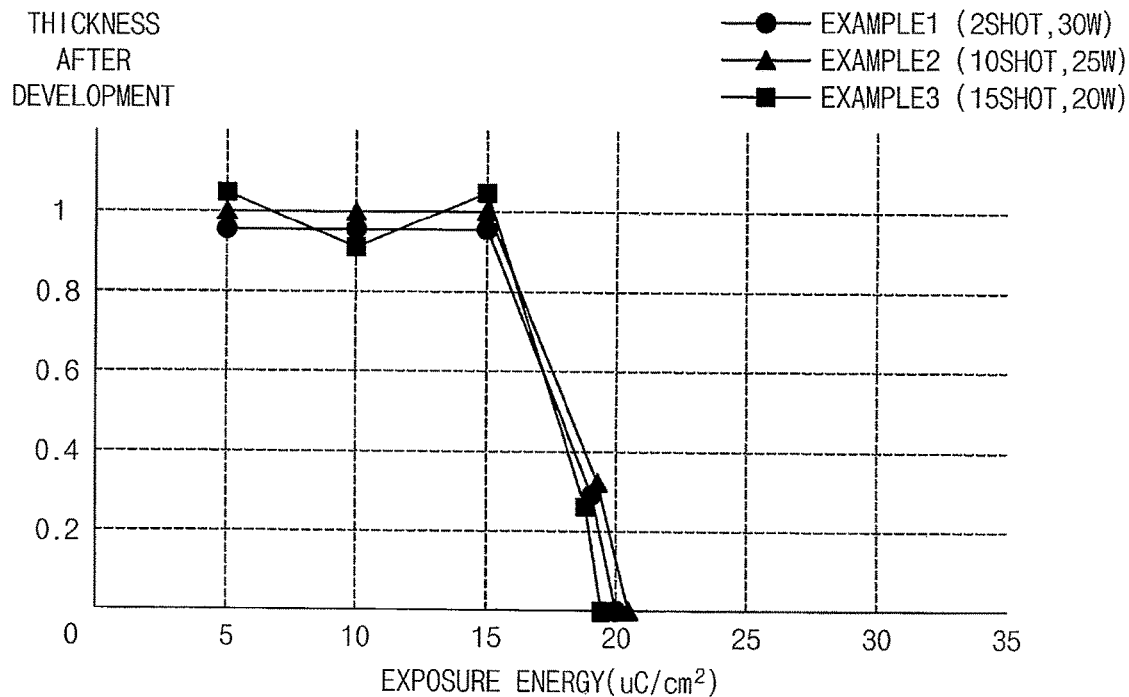
FIG. 46 is a graph showing a thickness change of a photoresist layer after a PEB process and a developing process in accordance with Examples.

FIG. 46 is a graph showing a thickness change of a photoresist layer after a PEB process and a developing process in accordance with Examples.

PEB processes were performed using 2 laser shots, 10 laser shots, and 15 laser shots in Examples 1 to 3, respectively, and then the photoresist layers were removed by the developing process.

As shown in FIG. 46, the photoresist layers were substantially and completely removed at the exposure energy of about 20 $\mu C/cm^2$ in the Examples. Thus, without being bound by theory, it is believed that the exposed photoresist layer was uniformly activated by the PEB process using the plurality of laser shots, and the developing process was performed without a deviation according to the change of the exposure energy.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of patterning a photoresist layer, the method comprising:
    forming a photoresist layer on a substrate;
    exposing the photoresist layer to light using a first light source so as to induce a chemical change in the photoresist layer;
    performing a post-exposure bake process on the photoresist layer, the post-exposure bake process including irradiating the photoresist layer with at least two shots of laser light from a second light source such that the photoresist layer is heated to a first temperature; and
    performing a developing process on the photoresist layer after the post-exposure bake process, the development process selectively removing a portion of the photoresist layer.

2. The method as claimed in claim 1, wherein each shot of the at least two shots has a duration of one millisecond or less.

3. The method as claimed in claim 1, wherein each shot of the at least two shots has a same duration.

4. The method as claimed in claim 1, wherein a shot of the at least two shots has a duration that is different from a duration of another of the at least two shots.

5. The method as claimed in claim 1, wherein each shot of the at least two shots heats the photoresist layer irradiated by the laser light to the first temperature.

6. The method as claimed in claim 1, wherein an interval time between shots varies between at least two of the shots.

7. The method as claimed in claim 1, wherein the exposed photoresist layer is activated at the first temperature.

8. The method as claimed in claim 7, wherein activating the exposed photoresist layer at the first temperature includes removing a protecting group from a chemical compound in the photoresist layer.

9. The method as claimed in claim 1, further comprising not providing a separate cooling time following the post-exposure bake.

10. The method as claimed in claim 1, wherein the first light source is an ArF source, a KrF source, an electron beam source, an I-line source, or an extreme ultraviolet source, and the second light source is an infrared source.

11. The method as claimed in claim 1, wherein the photoresist layer includes a photoacid generator, and the chemical change in the photoresist layer includes generating an acid from the photoacid generator.

12. The method as claimed in claim 1, wherein the shots overlap in a plan view of the photoresist layer.

13. The method as claimed in claim 12, wherein at least two shots overlap.

14. The method as claimed in claim 12, wherein three or more shots overlap.

15. The method as claimed in claim 12, wherein the laser light is irradiated on the photoresist layer in a first direction, and the shots overlap in a second direction different from the first direction.

16. The method as claimed in claim 15, wherein the second direction is substantially perpendicular to the first direction.

17. A method of manufacturing a semiconductor device, the method comprising:
    forming a photoresist layer on a substrate;
    exposing the photoresist layer to light using a first light source so as to induce a chemical change in the photoresist layer;
    performing a post-exposure bake process on the photoresist layer, the post-exposure bake process including irradiating the photoresist layer with at least two shots of laser light from a second light source such that the photoresist layer is heated to a first temperature;
    performing a developing process on the photoresist layer after the post-exposure bake process, the development process selectively removing a portion of the photoresist layer; and
    patterning a layer underlying the developed photoresist layer.

* * * * *